United States Patent
Weng et al.

(10) Patent No.: US 10,007,177 B2
(45) Date of Patent: Jun. 26, 2018

(54) METHOD TO DEFINE MULTIPLE LAYER PATTERNS USING DOUBLE EXPOSURES

(71) Applicant: Taiwan Semiconductor Manufacturing Company, Ltd., Hsin-Chu (TW)

(72) Inventors: Ming-Huei Weng, Hsin-Chu (TW); Ching-Yu Chang, Hsin-Chu (TW); Chun-Kuang Chen, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 14/832,931

(22) Filed: Aug. 21, 2015

(65) Prior Publication Data

US 2017/0052445 A1 Feb. 23, 2017

(51) Int. Cl.
*G03F 7/11* (2006.01)
*G03F 7/00* (2006.01)
*G03F 7/20* (2006.01)
*G03F 7/32* (2006.01)
*G03F 7/38* (2006.01)

(52) U.S. Cl.
CPC .......... *G03F 7/0035* (2013.01); *G03F 7/2022* (2013.01); *G03F 7/32* (2013.01); *G03F 7/38* (2013.01)

(58) Field of Classification Search
CPC .......... G03F 7/0035; G03F 7/09; G03F 7/094; G03F 7/11
See application file for complete search history.

(56) References Cited

U.S. PATENT DOCUMENTS

| 5,886,102 A | 3/1999 | Sinta et al. |
| 6,338,934 B1 | 1/2002 | Chen et al. |
| 6,852,473 B2 | 2/2005 | Roberts et al. |
| 7,727,708 B2 * | 6/2010 | Colburn .................. G03F 7/094 430/311 |

(Continued)

FOREIGN PATENT DOCUMENTS

TW 200910002 A 3/2009

OTHER PUBLICATIONS http://en.wikipedia.org/wiki/Hansen_solubility_parameter.
http://cool.conservation-us.org/coolaic/sg/bpg/annual/v03/bp03-04.html.

*Primary Examiner* — Kathleen Duda
(74) *Attorney, Agent, or Firm* — Haynes and Boone, LLP

(57) ABSTRACT

A method of fabricating a semiconductor device includes forming a first photoresist layer over a substrate, over which a protective layer material is deposited to form a protective layer. A second photoresist layer is formed over the protective layer. A first lithography exposure process is performed, through a first mask, to expose the first and second photoresist layers, and to form a bottom latent pattern. A second lithography exposure process is performed, through a second mask, to expose the first and second photoresist layers, and to form a top latent pattern, where the top latent pattern at least partially overlaps the bottom latent pattern. The first and second photoresist layers and the protective layer are developed to form a first main feature and a second main feature from the bottom and top latent patterns respectively, and an opening in the protective layer vertically aligned with the second main feature.

20 Claims, 26 Drawing Sheets

(56) References Cited

U.S. PATENT DOCUMENTS

| | | |
|---|---|---|
| 7,759,253 B2 | 7/2010 | Chang |
| 7,871,761 B2 | 1/2011 | Hatakeyama et al. |
| 7,993,808 B2 | 8/2011 | Chang |
| 8,088,548 B2 | 1/2012 | Houlihan et al. |
| 8,088,550 B2 | 1/2012 | Tarutani et al. |
| 8,202,680 B2 | 6/2012 | Chang |
| 8,216,767 B2 | 7/2012 | Wang et al. |
| 8,323,870 B2 | 12/2012 | Lee et al. |
| 8,580,117 B2 | 11/2013 | Kao et al. |
| 8,597,870 B2 | 12/2013 | Chang |
| 8,658,344 B2 | 2/2014 | Wang et al. |
| 8,715,919 B2 | 5/2014 | Chang et al. |
| 8,741,551 B2 | 6/2014 | Wu et al. |
| 8,791,024 B1 | 7/2014 | Lu et al. |
| 2007/0207406 A1 | 9/2007 | Guerrero et al. |
| 2009/0311624 A1 | 12/2009 | Horiguchi et al. |
| 2013/0323641 A1 | 12/2013 | Chang |
| 2014/0011133 A1 | 1/2014 | Liu et al. |
| 2014/0017615 A1 | 1/2014 | Chang |
| 2014/0017616 A1 | 1/2014 | Chang |
| 2014/0065843 A1 | 3/2014 | Chang et al. |
| 2014/0117563 A1 | 5/2014 | Yu et al. |
| 2014/0120459 A1 | 5/2014 | Liu et al. |
| 2014/0186773 A1 | 7/2014 | Chang |
| 2014/0255850 A1 | 9/2014 | Chang et al. |
| 2014/0272709 A1 | 9/2014 | Liu et al. |
| 2014/0272726 A1 | 9/2014 | Chang |
| 2014/0273457 A1 | 9/2014 | Su et al. |
| 2014/0273521 A1 | 9/2014 | Wu et al. |

\* cited by examiner

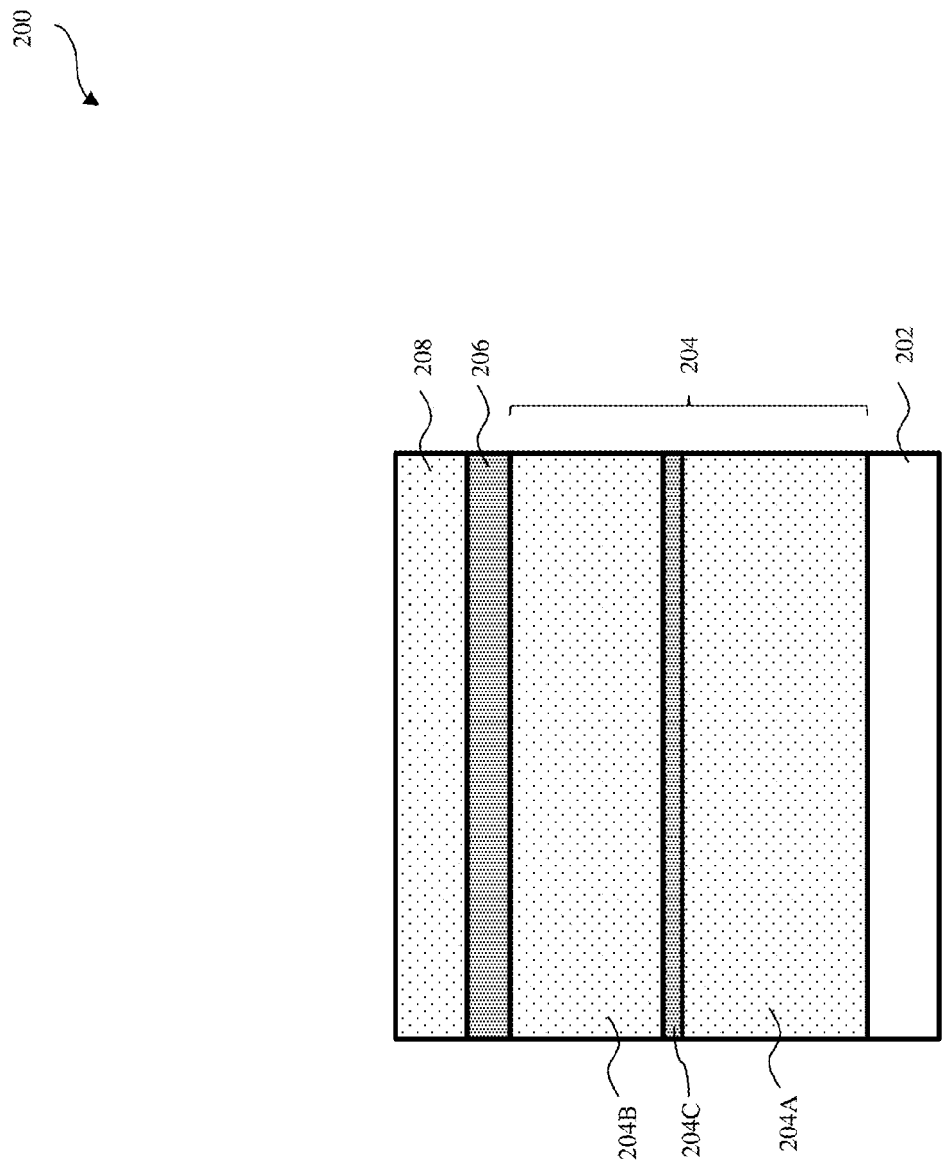

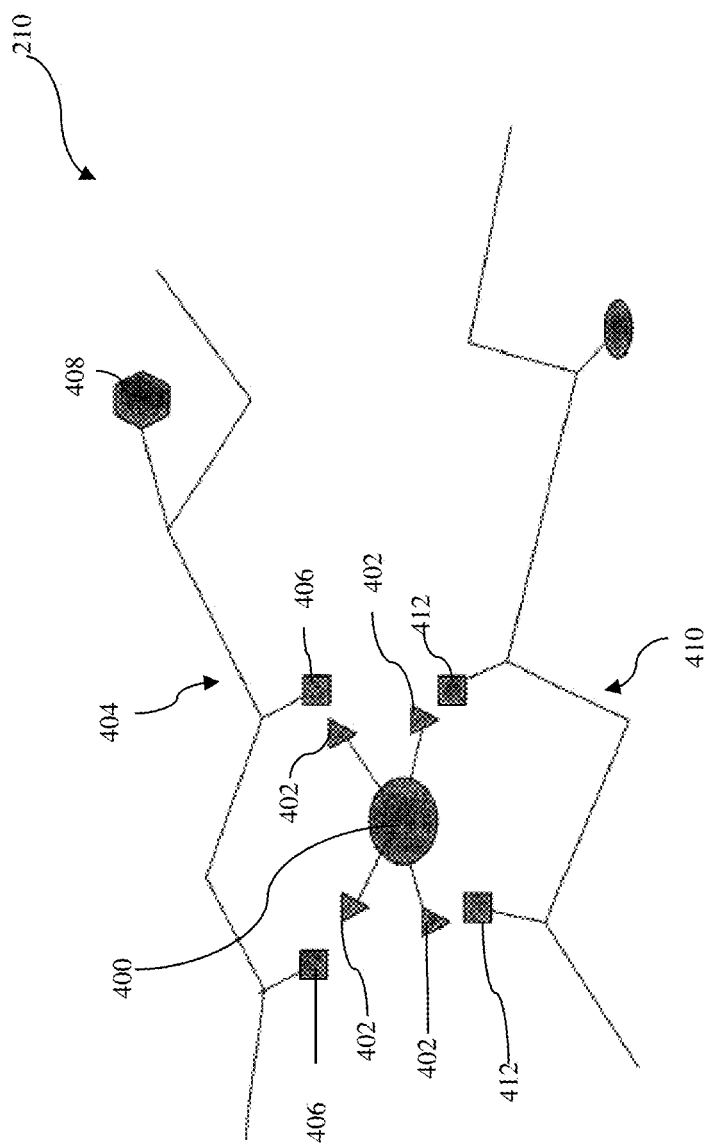

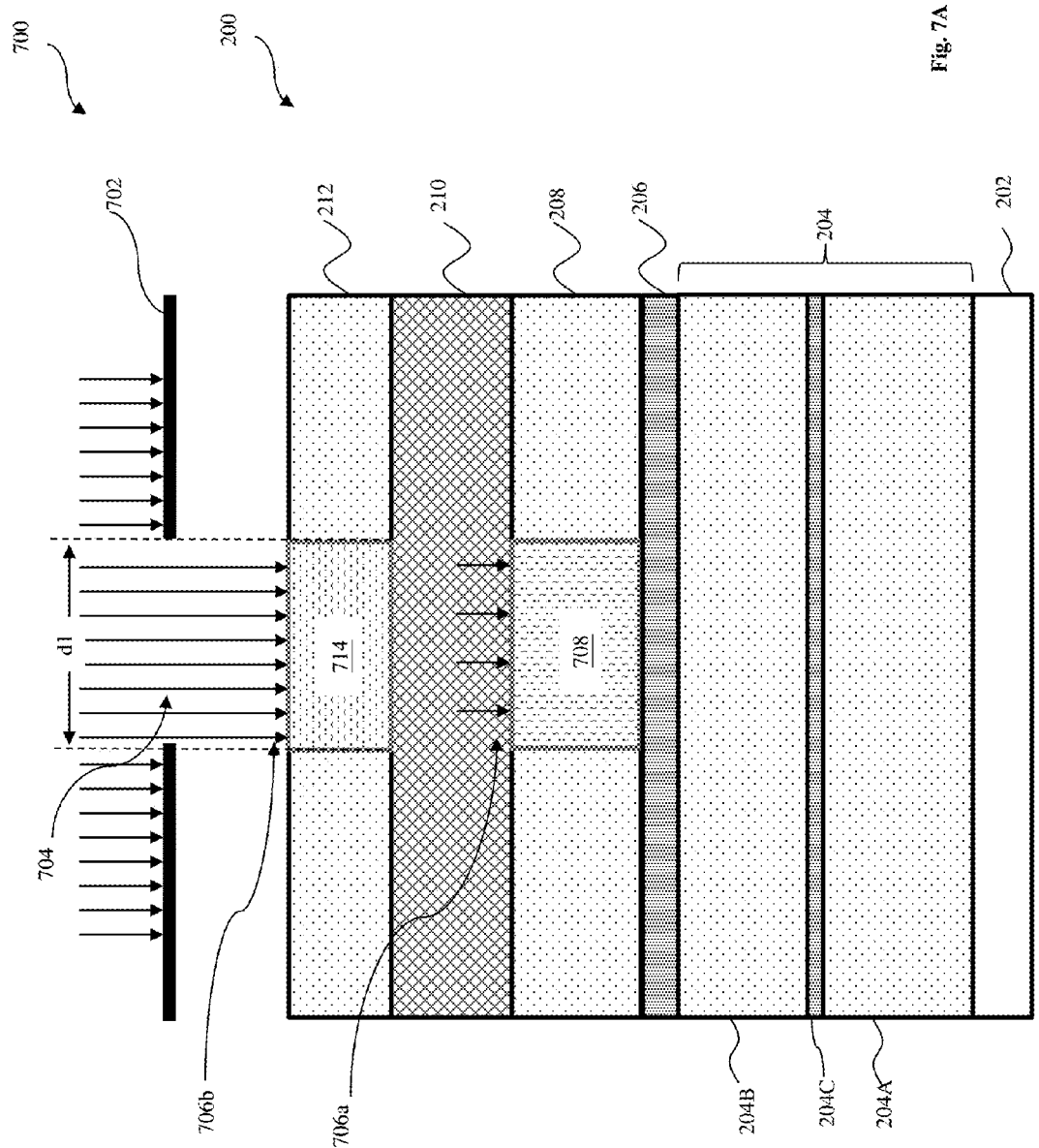

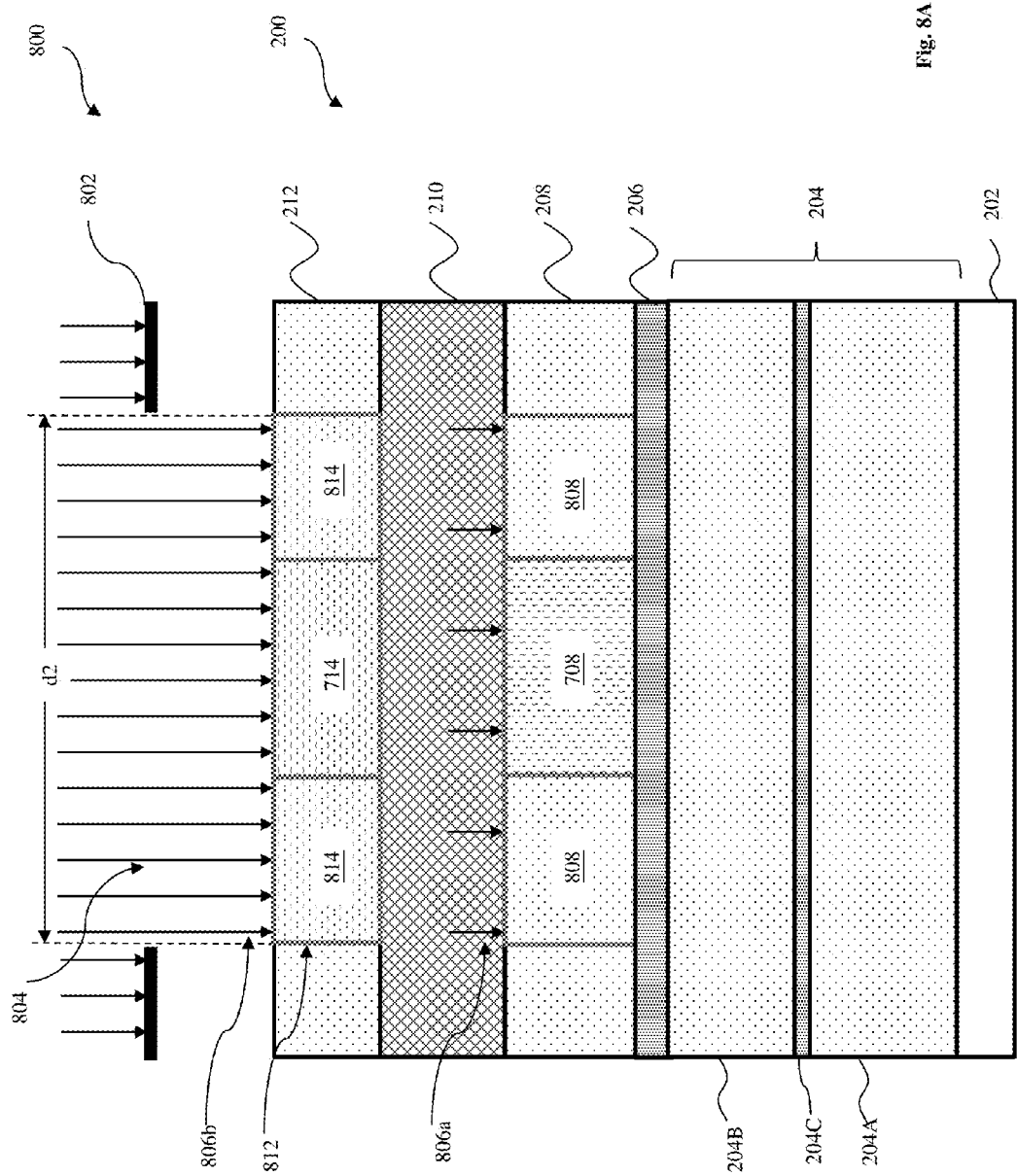

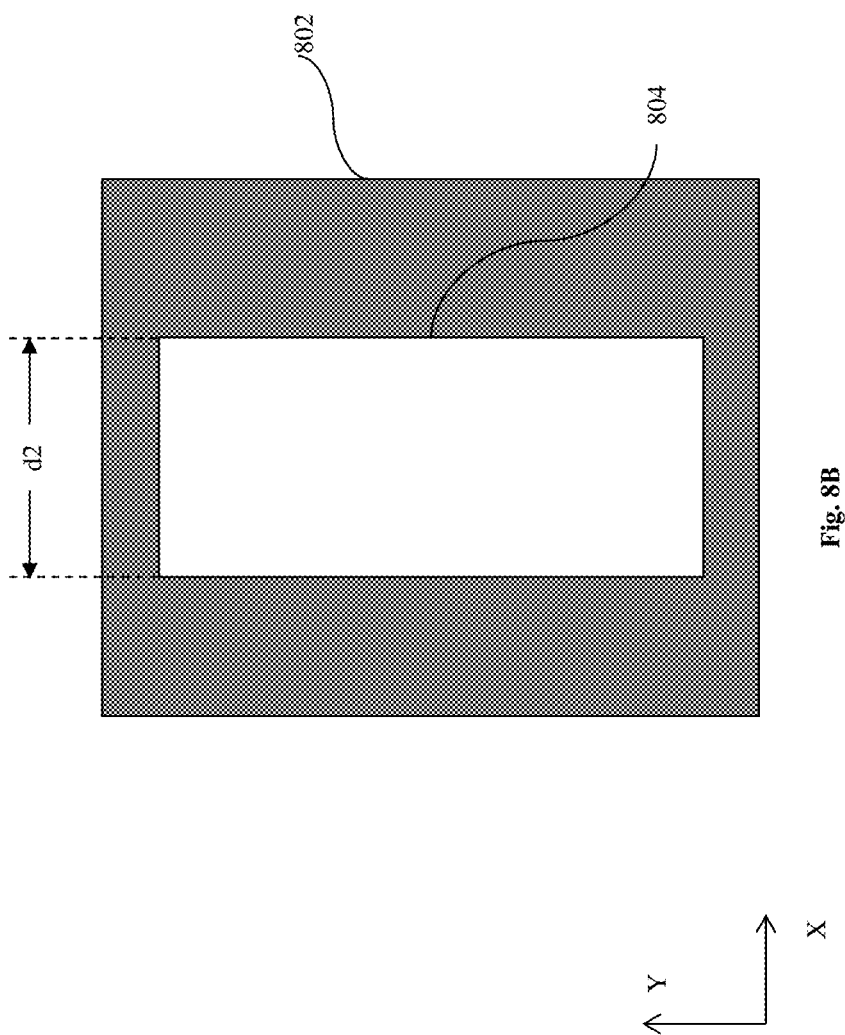

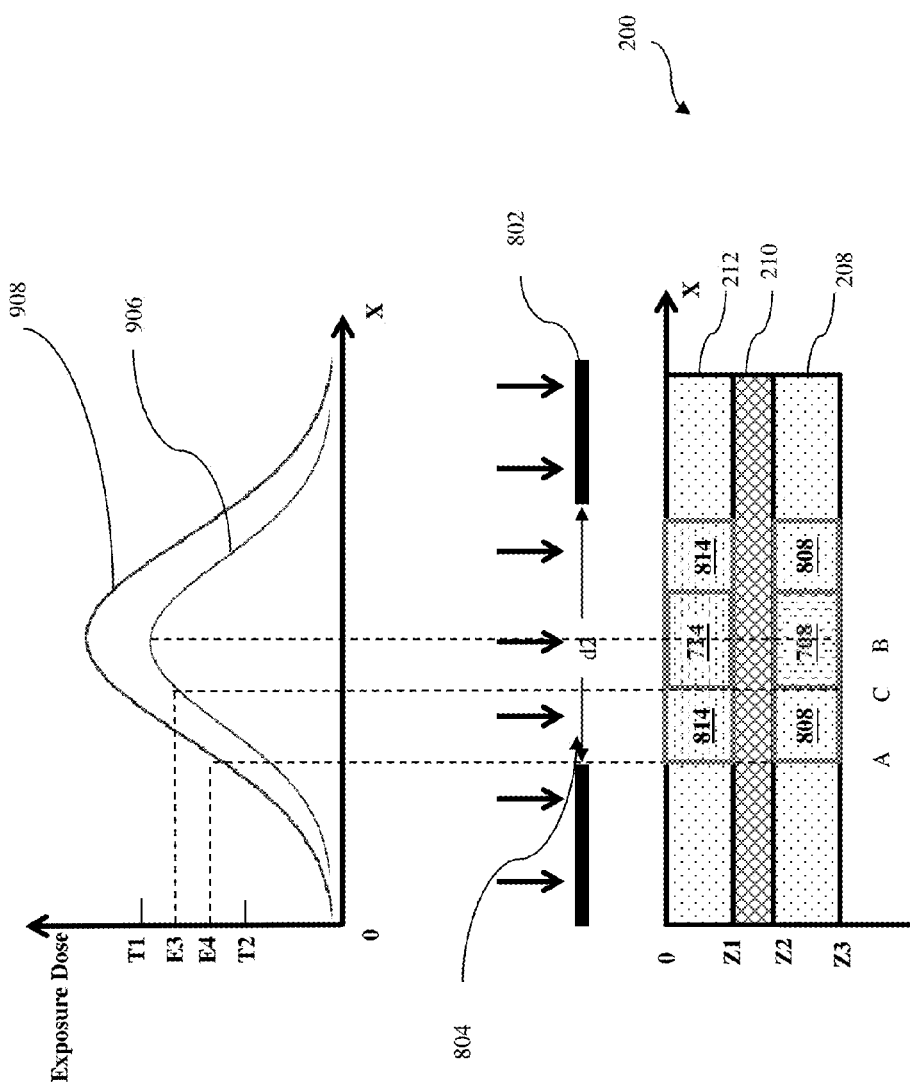

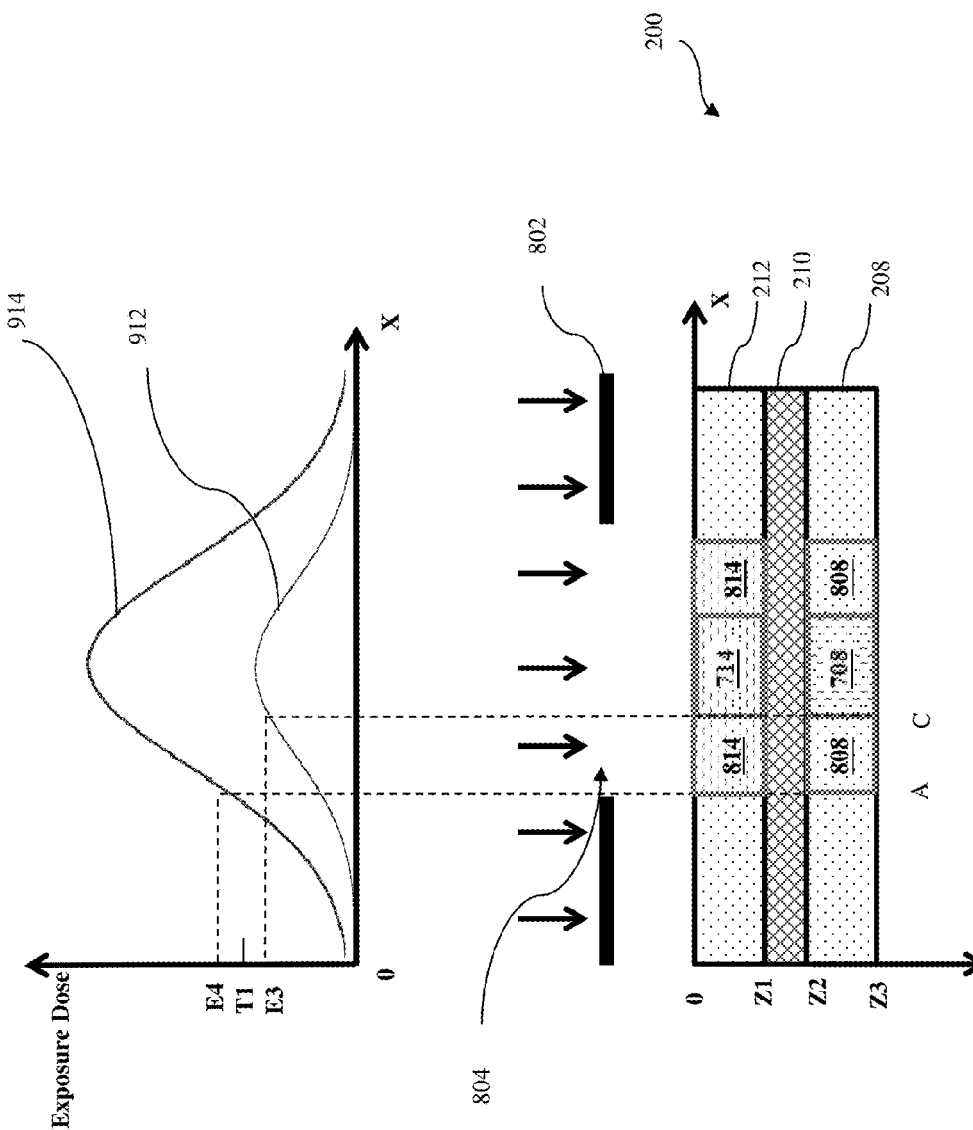

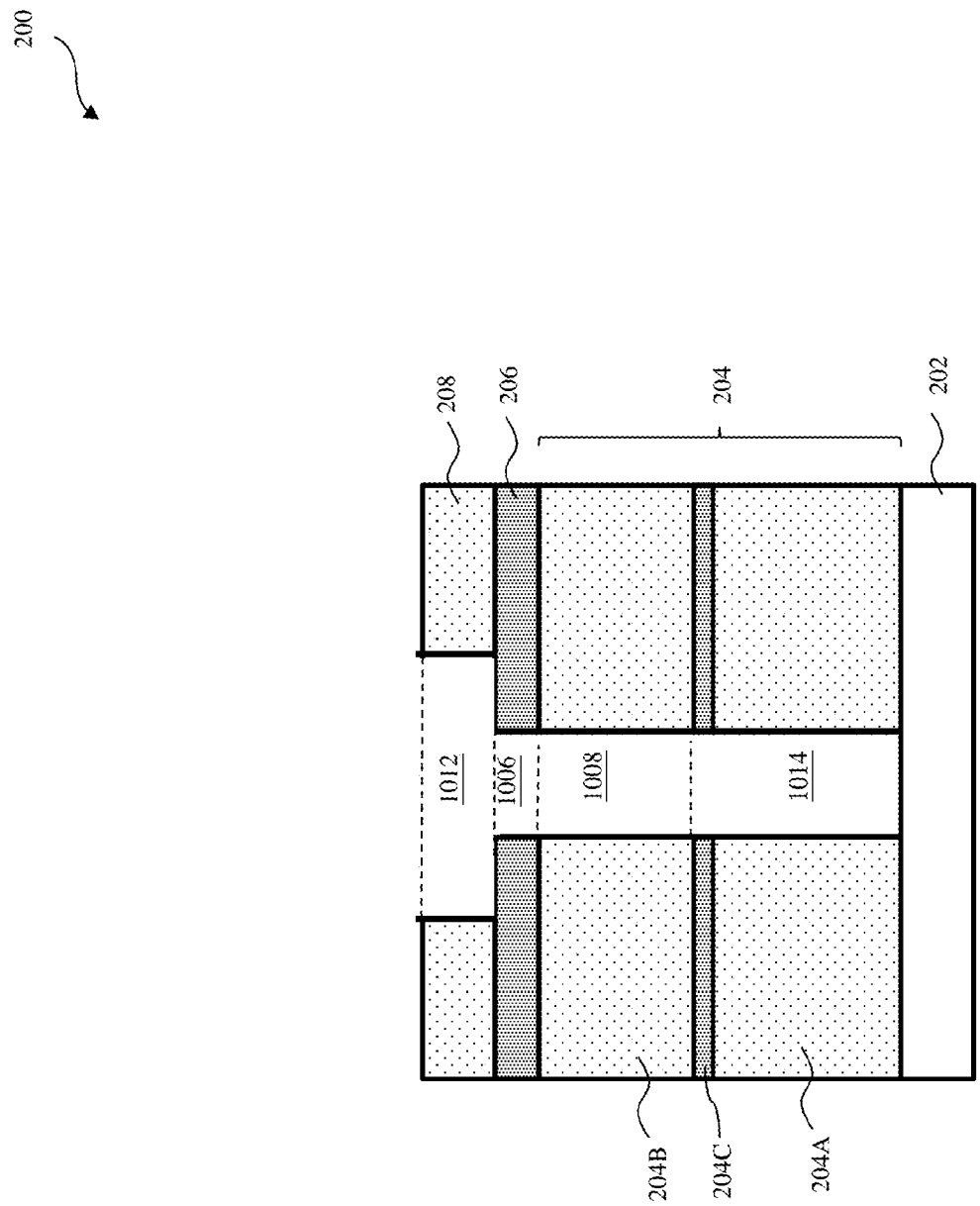

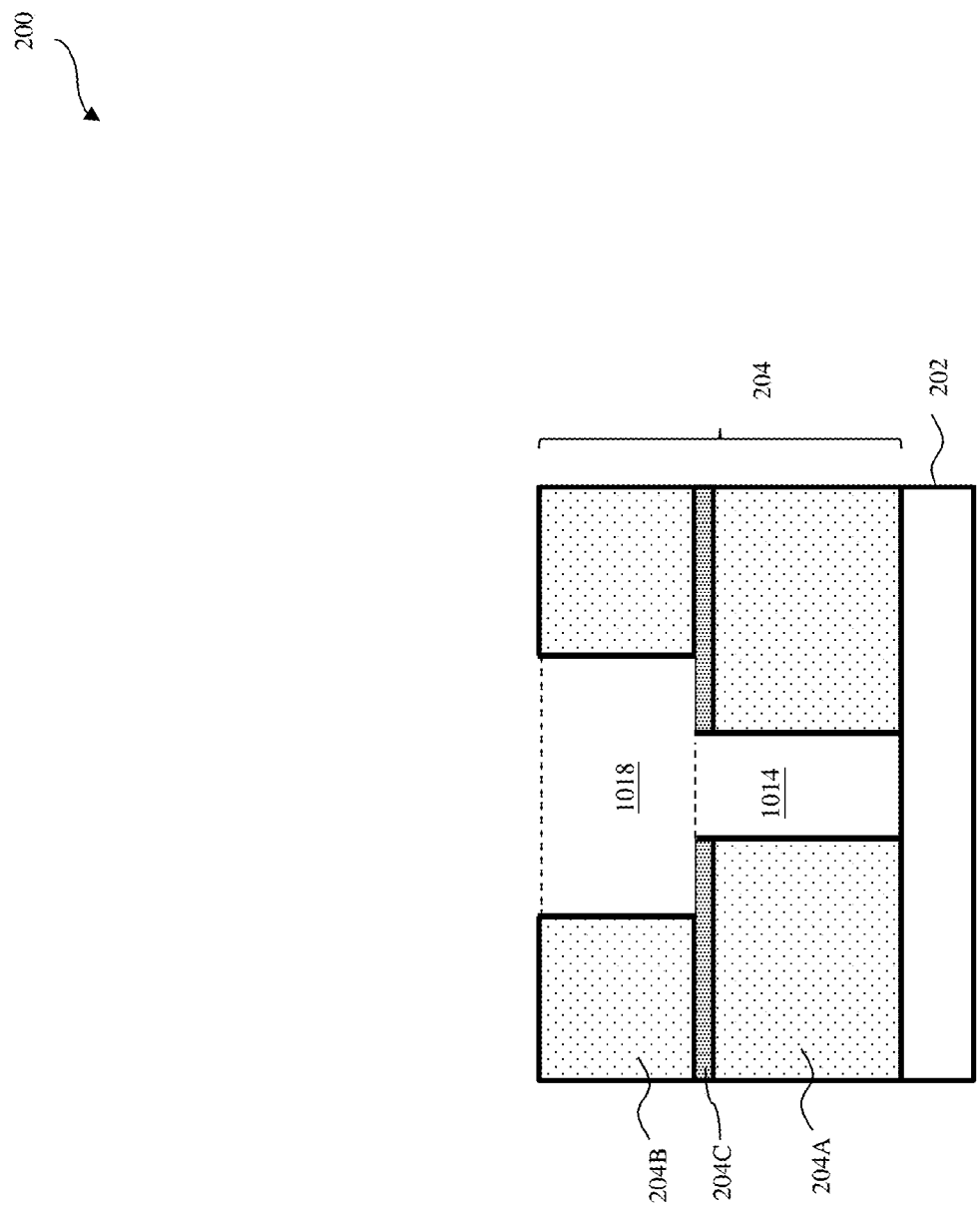

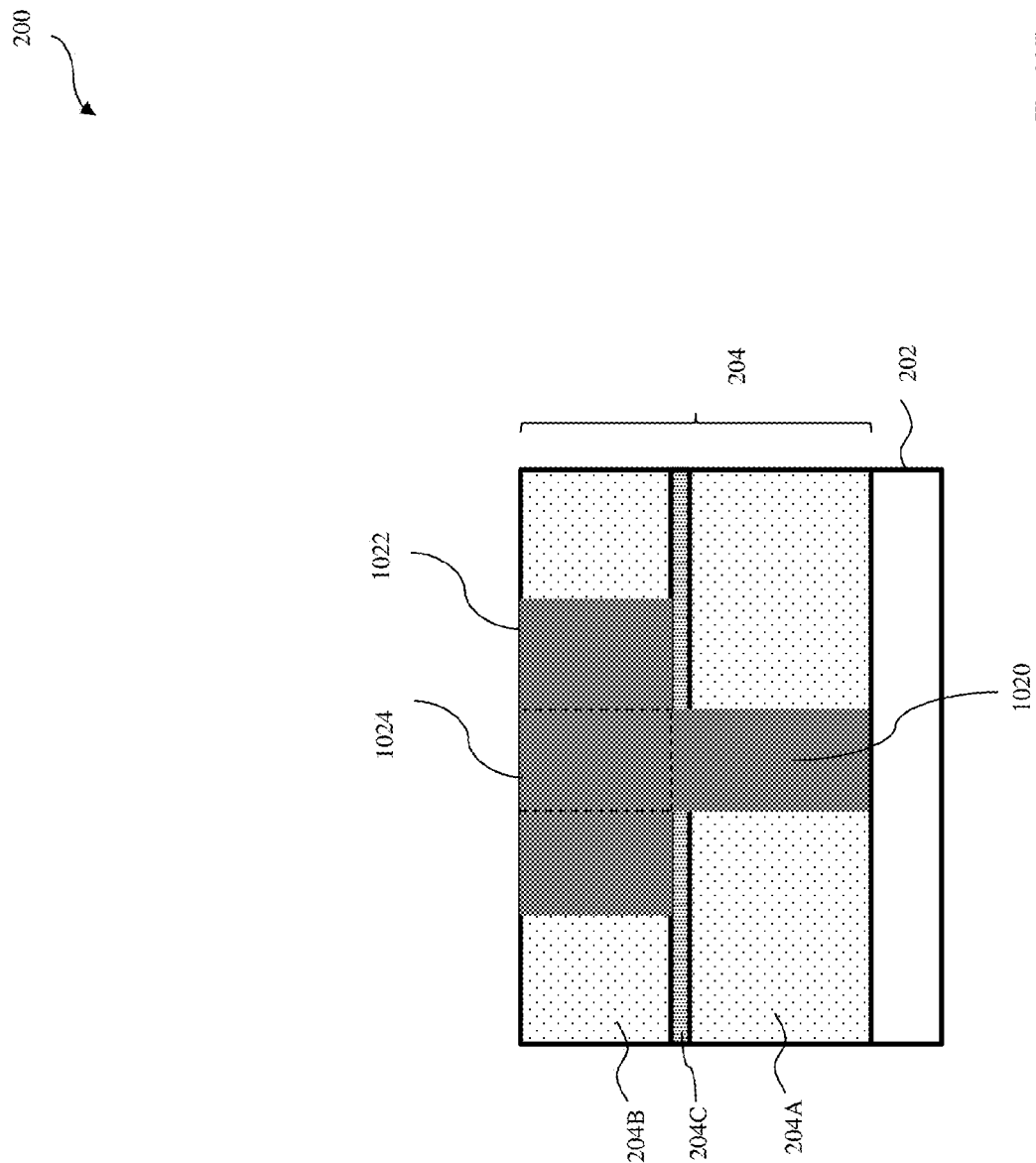

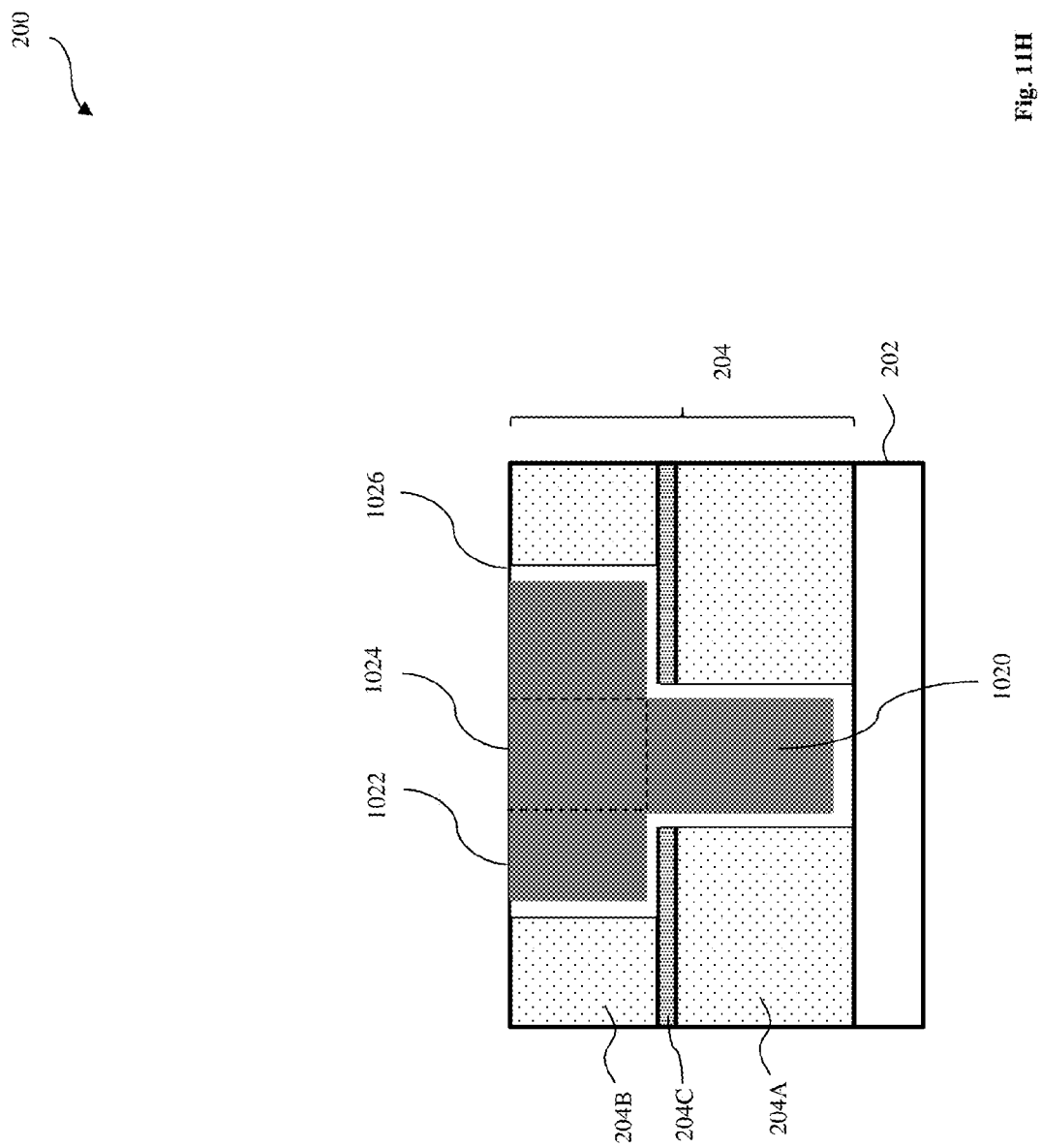

METHOD TO DEFINE MULTIPLE LAYER PATTERNS USING DOUBLE EXPOSURES

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of integrated circuit evolution, functional density (i.e., the number of interconnected devices per chip area) has generally increased while geometry size (i.e., the smallest component (or line) that can be created using a fabrication process) has decreased.

ICs are commonly formed by depositing a sequence of material layers, some of which are patterned by a lithography process. Double patterning techniques may be utilized to fabricate complex patterns. The double patterning techniques usually provide lower and upper photoresist layers disposed on a substrate. The materials in the lower and upper photoresist layers may intermix with each other, which will negatively impact the formation of the patterns. Furthermore, as the technology nodes shrink, the process overlay margins also shrink, and become more and more critical. Therefore, there is also a need to reduce the impact of overlay errors in the double patterning techniques. Moreover, the double patterning techniques usually involve multiple development or etch process steps, which are significant contributors to the overall cost of manufacturing, including processing time and the cost of materials. Accordingly, a method to address the above issues is needed.

BRIEF DESCRIPTION OF THE DRAWINGS

Aspects of the present disclosure are best understood from the following detailed description when read with the accompanying figures Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a cross-sectional view of a portion of a semiconductor device after forming a first photoresist layer on the substrate according to some embodiments.

FIG. 4B is a schematic view of the protective layer according to some embodiments.

FIG. 7A is a cross-sectional view of a portion of a semiconductor device to which a first lithography exposure process is performed according to some embodiments.

FIG. 8A is a cross-sectional view of a portion of a semiconductor device to which a second lithography exposure process is performed according to some embodiments. FIG. 8B is a top view of a photomask used in the example of FIG. 8A according to some embodiments.

FIGS. 9B, 9C, and 9E are diagrammatical views of various exposure dose curves during lithography exposure processes according to various embodiments.

FIGS. 11A-11H are cross-sectional views of a portion of a semiconductor device at various stages transferring the patterns formed in the first photoresist layer and the second photoresist layer to the substrate according to some embodiments.

DETAILED DESCRIPTION

Figure 1:
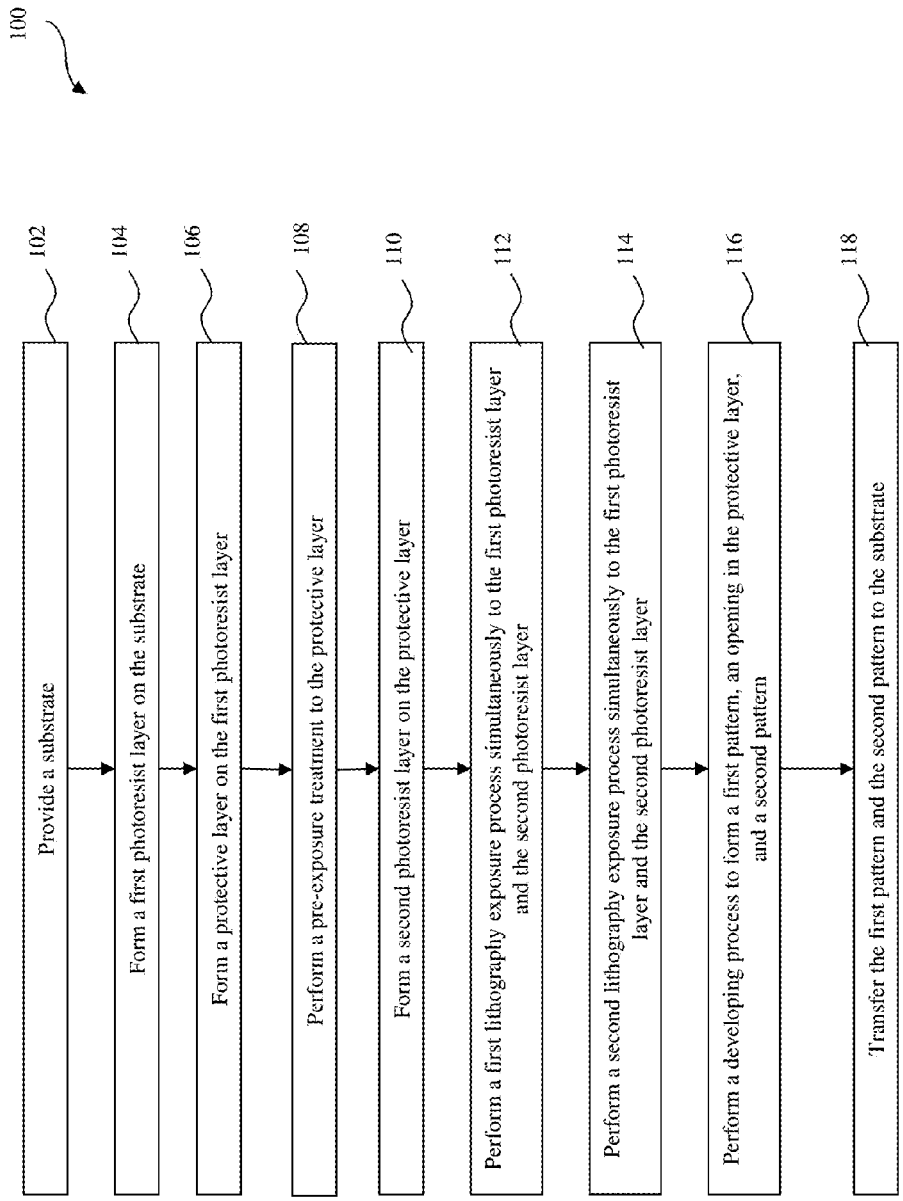
FIG. 1 is a flowchart illustrating an embodiment of a method of forming a semiconductor device or portion thereof according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of fabricating a semiconductor device is described below with reference to FIGS. 1-11H. Throughout the various views and illustrative embodiments, like reference numbers are used to designate like elements.

Referring now to FIG. 1, illustrated therein is a flowchart of one embodiment of a method 100 used to fabricate a semiconductor device. The method 100 begins at block 102 where a substrate is provided. Referring to the example of FIG. 2, in an embodiment of block 102, a device 200 is provided. The device 200 includes a substrate 202 (also referred to as a wafer), a first material layer 204 disposed over the substrate 202, and a second material layer 206 disposed over the first material layer 204.

The substrate 202 may be a semiconductor substrate such as a silicon substrate. In some embodiments, the substrate 202 may include various layers, including conductive or insulating layers formed on a semiconductor substrate. In some examples, the substrate 202 may include various doping configurations depending on design requirements as is known in the art. In some embodiments, the substrate 202 may also include other semiconductors such as germanium, silicon carbide (SiC), silicon germanium (SiGe), or diamond. Alternatively, in some embodiments, the substrate 202 may include a compound semiconductor and/or an alloy semiconductor. Further, in some embodiments, the substrate 202 may include an epitaxial layer (epi-layer), may be strained for performance enhancement, may include a silicon-on-insulator (SOI) structure, and/or may have other suitable enhancement features. The substrate 202 may include other features, such as shallow trench isolation (STI) features. The substrate 202 may also include a portion of an interconnect structure that includes metal lines in various metal layers, via features to provide vertical connection between the metal lines in the adjacent metal layers, and contact features to provide vertical connection between the metal lines in the metal layers and various device features (such as gates, sources and drains) on the substrate.

Figure 2:
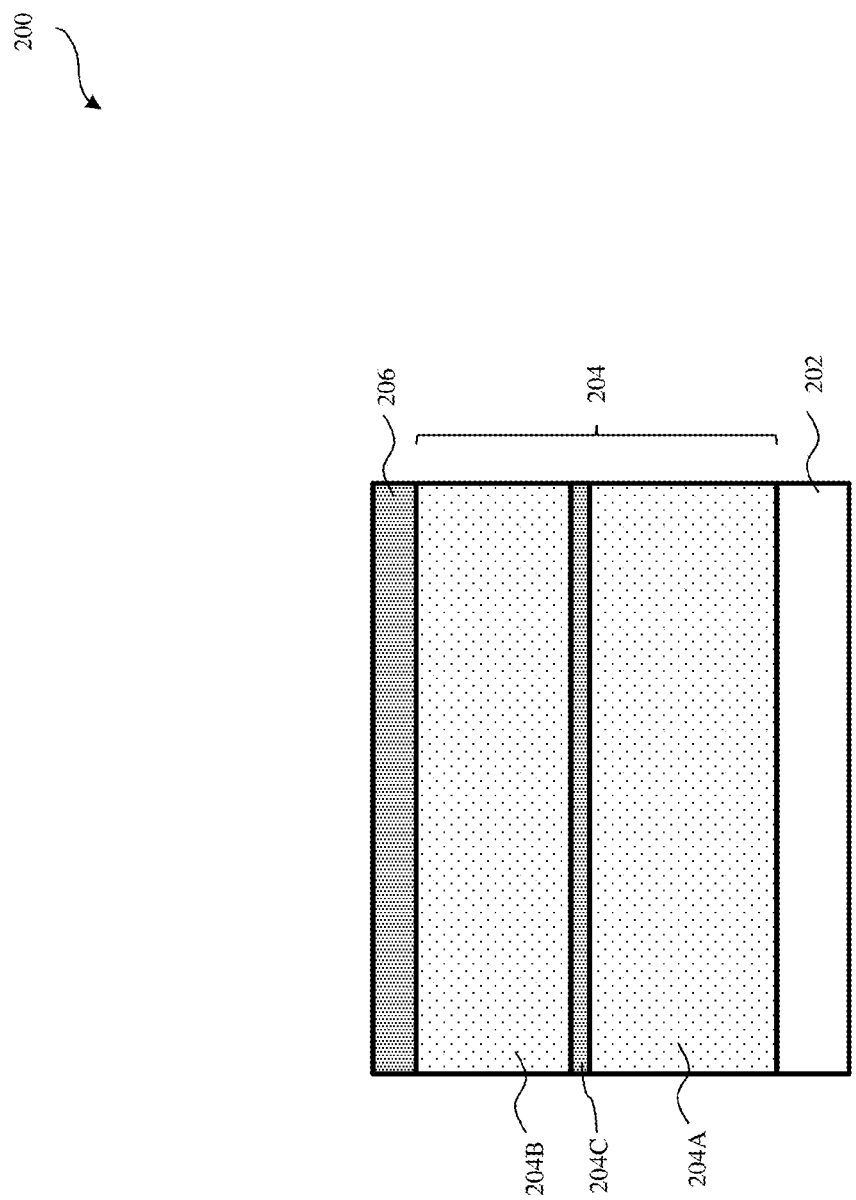
FIG. 2 is a cross-sectional view of a portion of a semiconductor device according to an embodiment of the present disclosure.
Figure 4A:
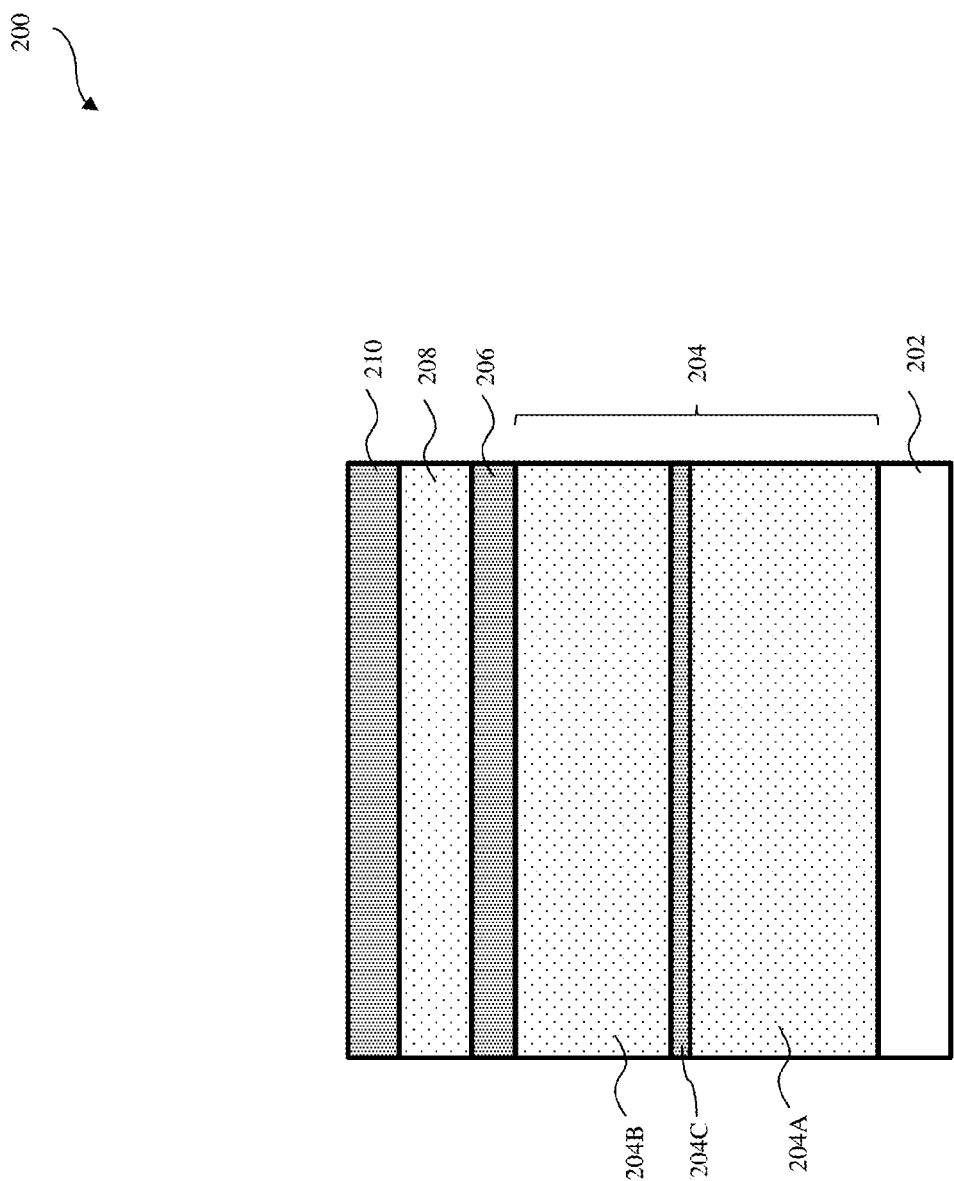
FIG. 4A is a cross-sectional view of a portion of a semiconductor device after forming a protective layer on the first photoresist layer according to some embodiments.

Still referring to the example of FIG. 2, various material layers may be formed on the substrate 202. As illustrated in FIG. 2, the first material layer 204 is formed on the substrate 202, and the second material layer 206 is formed on the first material layer 204. The first material layer 204 may include plurality of dielectric films. In the example of FIG. 2, the first material layer 204 includes a first interlayer dielectric (ILD) material layer 204A formed on the substrate 202, an etch stop layer 204C formed over the first IDL material layer 204A, and a second IDL material layer 204B formed over the etch stop layer 204C.

In some embodiments, the first ILD material layer 204A includes silicon oxide, silicon oxynitride, a low-K dielectric material or other suitable dielectric material. In some embodiments, the first ILD material layer 204A may include a single layer or multiple layers. By way of example, the first ILD material layer 204A may be formed by any of a plurality of suitable techniques including CVD, ALD, and spin-on techniques (e.g., for depositing spin-on-glass).

The etch stop layer 204C may be formed over the first ILD material layer 204A. The etch stop layer 204C may have a proper etch selectivity to stop etch during subsequent operations to pattern the first ILD material layer 204A and second ILD material layer 204B, which will be discussed below in detail with reference to FIGS. 11B-11F. The etch stop layer 204C may include a dielectric material that is different in composition from the materials included in the first ILD material layer 204A and the second ILD material layer 204B. The etch stop layer 204C may include a dielectric material, such as silicon nitride, silicon oxynitride, or silicon carbide, other suitable materials, and/or a combination thereof. In some examples, the etch stop layer 204C may include multiple layers, including a silicon nitride layer, a silicon carbon nitride layer, a silicon oxynitride layer, other suitable layers, and/or a combination thereof. The etch stop layer 204C may be formed by chemical vapor deposition (CVD), spin-on coating, plasma-enhanced chemical vapor deposition (PECVD) process and/or other suitable deposition or oxidation processes.

The second ILD material layer 204B is similar to the first ILD material layer 204A in terms of composition and formation. For example, the second ILD material layer 204B may include a single layer or multiple layers. By way of example, the second ILD material layer 204B may be formed by any of a plurality of suitable techniques including CVD, ALD, and spin-on techniques (e.g., for depositing spin-on-glass).

In some embodiments, a second material layer 206 may be formed on the first material layer 204. The second material layer 206 may function as a hard mask layer during subsequent operations to pattern the first material layer 204, which will be discussed in detail below with reference to FIGS. 11B-11G. The second material layer 206 may include aluminum oxide. The second material layer 206 may include one or more films to enhance the operations of patterning the first material layer 204.

Referring now to FIG. 1, in an embodiment, the method 100 then proceed to block 104, where a first photoresist layer is formed on the substrate 202. Referring to the example of FIG. 3, a first photoresist layer 208 may be formed by depositing a first photoresist composition over the second material layer 206. The first photoresist layer 208 may include a photoresist material and a solvent. In some embodiments, the photoresist material includes a polymer. In one example, the molecular weight of the photoresist material may be controlled for the quality of the lithography exposure process. In another example, the molecular weight of the photoresist material is between about 1000 and 20000. In some embodiments, the first photoresist layer 208 may further include a quencher and/or other additives.

In some embodiments, the photoresist material of the first photoresist layer 208 includes a chemically amplified (CA) resist material. The CA resist material may be a positive CA resist material, which includes an acid cleavable polymer that turns soluble in a developer such as a base solution after the acid cleavable polymer is cleaved by an acid (e.g., an acid generated by photo-acid generator (PAG)). In an example, the acid cleavable polymer cleaved by the acid becomes more hydrophilic, and may be soluble in a basis solution. For example, the he acid cleavable polymer cleaved by the acid may be soluble in a tetramethylammonium hydroxide (TMAH) developer. In another example, the TMAH developer includes a TMAH solution with a proper concentration ranging about between 0 and 15% by weight. In yet another example, the TMAH developer includes a TMAH solution with a concentration of about 2.38% by weight. In furtherance of the embodiments when the CA resist material is used, the photoresist material of the first photoresist layer 208 may include a photo-acid generator (PAG) distributed in the first photoresist layer 208. When absorbing photo energy, the PAG decomposes and forms a small amount of acid. The PAG may have a concentration ranging between about 1% and 30% by weight of the first photoresist layer 208. In some embodiments, the PAG can be ionic type (onium salt), such as metallic or sulfonate. The PAG may alternatively be non-ionic, such as sulfonate ester, 2 nitrobenzyl ester, organohalide, aromatic sulfonate, oxime sulfonate, N-sulfonyloxyimide, sulfonloxy ketone, or diazonaphthoquinone (DNQ) 4 sulfonate.

The first photoresist layer 208 may additionally include other components, such as a quencher. In an example, the quencher is base type and is capable of neutralizing acid. Collectively or alternatively, the quencher may inhibit other active components of the first photoresist layer 208, such as inhibiting photoacid from reaction. Examples of optional additives further include photo decomposable quencher (PDQ), photo base generator (PBG) that may be used to inactivate acid generated by exposure, thermal base generator, thermal acid generator, acid amplifier, chromophore, other suitable materials, and/or a combination thereof.

In some embodiments, the first photoresist layer 208 does not include a crosslinking agent and/or crosslinkable polymers, and the first photoresist layer 208 is not cross-linked under a subsequent pre-exposure treatment process.

In some embodiments, the first photoresist layer 208 may be formed by spin-on coating or other suitable technique. Other steps, such as baking, may follow the coating of the first photoresist layer 208. In some embodiments, the solvent of the first photoresist layer 208 may be partially evaporated by a soft baking process.

Referring now to FIG. 1, the method 100 then proceeds to block 106, where a protective layer is formed on the first photoresist layer 208. Referring to the example of FIG. 4A, a protective layer 210 is formed over the first photoresist layer 208 by depositing a protective layer composition on the first photoresist layer 208. In some embodiments, the protective layer 210 may be designed to reduce intermixing between the first photoresist layer 208 and a second photoresist layer 212 (described below with reference to FIG. 6), where the second photoresist layer 212 is disposed over the protective layer 210. In some embodiments, the protective layer 210 may be designed to control the exposure dose to the first photoresist layer 208 by absorbing partially the exposing beam projected on the second photoresist layer 212. In some embodiments, the protective layer 210 may function as a hard mask during subsequent operations to pattern the first material layer 204.

In some embodiments, the protective layer 210 includes a solvent. In some embodiments, the solvent includes de-ionized water (DIW). In some embodiments, the polarity of the solvent is designed according to the polarity of the first photoresist layer 208 and/or the second photoresist layer 212. As used herein, the term "polarity" may be used to describe a dipole moment. In some embodiments, the solvent has a high polarity. As used herein, the term "high polarity" is used to describe the polarity of the solvent as compared to one or both of the first photoresist layer 208 and the second photoresist layer 212. For example, the solvent may have a polarity that is higher that either one or both of the polarities of the first photoresist layer 208 and the second photoresist layer 212. Additionally, the dipole moment of such a high polarity solvent may be higher than either one or both of the dipole moment of the first photoresist layer 208 and the second photoresist layer 212. In an example, the solvent has a dipole moment of between about 1 to 5 Debyes. In another example, the solvent has a dipole moment of about 5 Debyes. In some embodiments, the solvent may include one or more polar functional groups including $NO_2$, $-SO_3^-$, $-CN$, $-NCO$, $-OCN$, $-CO_2-$, $-OH$, $-SH$, $COO^-$, $NH_2$, other suitable polar functional groups, and/or a combination thereof. The polar functional groups may bond with each other and form hydrogen bonds.

In some embodiments, the composition of the solvent may be designed to achieve proper polar force and hydrogen bonding force, which may decrease the solubility of a neighboring layer (e.g., the first photoresist layer 208 and/or the second photoresist layer 212) in the solvent of the protective layer 210. In some embodiments, the composition of the solvent of the protective layer 210 is designed based of a solubility calculated based on the Hansen solubility parameters of the materials of the solvent of the protective layer 210 and the materials of the first photoresist layer 208, which may be used to predict if the first photoresist layer 208 will be dissolved in the solvent of the protective layer 210. The Hansen solubility parameters ($\delta$) characterize the materials according to their solubility components, which measure the strength of the intermolecular forces holding molecules together in a liquid state. The intermolecular forces include the dispersion force, the polar force, and the hydrogen bonding force. A distance (Ra) between Hansen solubility parameters between a solvent (e.g., the solvent of the protective layer 210) and a material (e.g., the material of the first photoresist layer 208 and/or the material of the second photoresist layer 212) may be calculated using the following formula, where $\delta_d$ measures the dispersion force, $\delta_p$ measures the dipolar intermolecular force, and the $\delta_h$ measures the hydrogen bonding force:

$$(Ra)^2 = 4(\delta_{d2} - \delta_{d1})^2 + (\delta_{p1} - \delta_{p1})^2 + (\delta_{h2} - \delta_{h1})^2.$$

Combining Ra with an interaction radius ($R_0$), the relative energy difference (RED) indicates whether material 1 (e.g. the material of the first photoresist layer 208 and/or the material of the second photoresist layer 212) is soluble in material 2 (e.g., the solvent of the protective layer 210):

$$RED = Ra/R_0.$$

If RED is less than 1, the solvent is expected to dissolve the material. If RED equals 1, the solvent is expected to dissolve the material partially. If RED is greater than 1, the solvent is not expected to dissolve the material.

In some embodiments, the composition and various properties (e.g., polarity) of the solvent of the protective layer 210 is designed such that a neighboring layer (e.g., the first photoresist layer 208 and/or the second photoresist layer 212) is not soluble in the solvent of the protective layer 210. In an example, an RED for the solvent of the protective layer 210 and the material of neighboring photoresist layers (e.g., the first photoresist layer 208 and/or the second photoresist layer 212) is greater than 1. In another example, the RED for the solvent of the protective layer 210 and the material of a neighboring layer (e.g., the first photoresist layer 208 and/or the second photoresist layer 212) is greater than about 1.25. In yet another example, the solvent of the protective layer 210 has a polar force that is substantially higher than the polar force of a neighboring layer (e.g., the first photoresist layer 208 and/or the second photoresist layer 212). In yet another example, the solvent of the protective layer 210 has a hydrogen bonding force that is substantially higher than the hydrogen bonding force of a neighboring layer (e.g., the first photoresist layer 208 and/or the second photoresist layer 212). In some embodiments, the solubility of the first photoresist layer 208 in the solvent of the protective layer 210 is low, and the first photoresist layer 208 is practically insoluble in the solvent of a neighboring layer (e.g., the first photoresist layer 208 and/or the second photoresist layer 212). For example, the first photoresist layer 208 may have a dissolution rate of less than about 5 angstroms per second in the solvent of a neighboring layer (e.g., the first photoresist layer 208 and/or the second photoresist layer 212).

In some embodiments, the protective layer 210 includes a polymer. The polymer may have high polarity. The polymer may contain one or more polar functional groups including $NO_2$, $-SO_3^-$, $-CN$, $-NCO$, $-OCN$, $-CO_2$, $-OH$, $-SH$, $COO^-$, $NH_2$, other suitable polar functional groups, and/or a combination thereof. The polar functional group may bond with each other and form hydrogen bonds. In some embodiments, the composition of the polymer may be designed to achieve proper polar force and hydrogen bonding force, which may decrease the solubility of the protective layer 210 in a solvent of a neighboring layer (e.g., the first photoresist layer 208 and/or the second photoresist layer 212).

The composition of the polymer of the protective layer 210 may affect the solubility of the protective layer 210 in a solvent of a neighboring layer (e.g., the first photoresist layer 208 and/or the second photoresist layer 212). In some embodiments, the composition of the polymer is designed to tune the solubility of the protective layer 210 according to a solubility calculated based on the Hansen Solubility Parameters, which may be used to predict if the protective layer 210 will be dissolved in a solvent of a neighboring layer (e.g., the first photoresist layer 208 and/or the second photoresist layer 212). The composition of the polymer may be designed such that the protective layer 210 is not soluble in the solvent of a neighboring layer (e.g., the first photoresist layer 208 and/or the second photoresist layer 212). In an example, an RED for the protective layer 210 and the solvent of a neighboring layer (e.g., the first photoresist layer 208 and/or the second photoresist layer 212) is greater than 1. In another example, the RED for the protective layer 210 and the solvent of a neighboring layer (e.g., the first photoresist layer 208 and/or the second photoresist layer 212) is greater than about 1.25. In some examples, the protective layer 210 has a polar force that is substantially higher than the polar force of the solvent of a neighboring layer (e.g., the first photoresist layer 208 and/or the second photoresist layer 212). In another example, the protective layer 210 has a hydrogen bonding force that is substantially higher than the hydrogen bonding force of the solvent of a neighboring layer (e.g., the first photoresist layer 208 and/or the second photoresist layer 212). In some embodiments, to ensure that the polar force and hydrogen bonding force are sufficiently high (e.g., to achieve a desired RED), the polymer may contain an amount ranging between 20% and 90% by weight of one or more polar functional groups. In one example, the polymer may contain about 90% by weight of one or more polar functional groups. In some embodiments, the solubility of the protective layer 210 in the solvent of a neighboring layer (e.g., the first photoresist layer 208 and/or the second photoresist layer 212) is low, and the protective layer 210 is practically insoluble in the solvent of a neighboring layer (e.g., the first photoresist layer 208 and/or the second photoresist layer 212). For example, the protective layer 210 may have a dissolution rate of less than 5 angstroms per second in the solvent of a neighboring layer (e.g., the first photoresist layer 208 and/or the second photoresist layer 212).

In some embodiments, the composition of the solvent of the protective layer 210 is designed such that the polymer of the protective layer 210 is soluble in the solvent of the protective layer 210. For example, the RED indicating whether the polymer is soluble in the solvent of the protective layer 210 is less than 1.

Referring now to FIG. 4B, in some embodiments, the protective layer 210 may include a crosslinking agent 400, a first crosslinkable polymer 404, and a second crosslinkable polymer 410. In some embodiments, the protective layer 210 may further include a catalyst. In some embodiments, when a subsequent pre-exposure treatment process is performed to the protective layer, which will be described in detail below with reference to FIG. 5, the first crosslinkable polymer 404 and second crosslinkable polymer 410 may be cross-linked by reactions between the crosslinkable polymers and the crosslinking agent 400. In some embodiments, the catalyst may be a compound used to initiate a cross-linking reaction between the crosslinkable polymers during the subsequent pre-exposure treatment process.

In some embodiments, the crosslinking agent 400 may include a crosslinkable functional group such as —I, —Br, —Cl, —NH$_2$, —COOH, —OH, —SH, —N$_3$, epoxy, alkyne, alkene, ketone, aldehyde, ester, acyl halide, NHS ester, Imidoester, pentafluorophenyl ester, Hydroxymethyl phosphine, Carbodiimide, Maleimide, Haloacetyl, Pyridyldisulfide, Thiosulfonate, Vinylsulfone, Hydrazide, Alkoxyamine, Diazirine, Aryl azide, Isocyanate, Phosphine, Amide, ether, polyether polyol, glycidyl ether, vinyl ether, methoxy methylated glycouril, alkyl oxide, triazene, other crosslinkable function groups, and/or combination thereof. Below are some exemplary formulas of the crosslinkable functional groups:

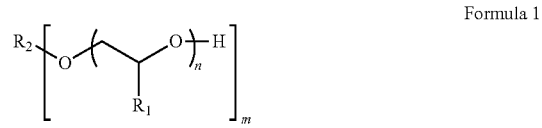

Formula 1

Formula 2

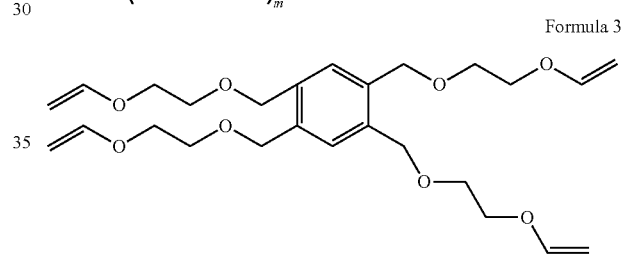

Formula 3

Formula 4

Formula 5

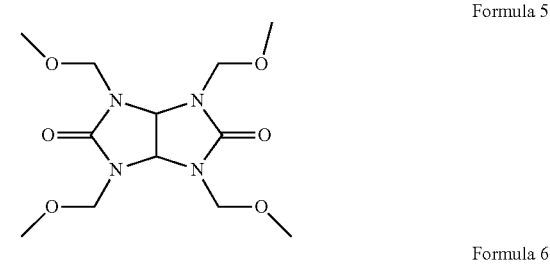

Formula 6

For example, Formula 1 represents a structure of a polyether polyol, and Formula 2 represents a structure of a glycidyl ether. R2 in Formula 1 and Formula 2 may represent an alkyl group. In some embodiments, the alkyl group may contain hydrogen attached to hydrocarbon having a straight, branched, or cyclic structure. In some embodiments, the alkyl group may contain a heteroatom. For example, the alkyl group may contain nitrogen or oxygen. For further example, Formulas 3 and 4 represent some structures of a vinyl ether, and Formula 5 represents a structure of a methoxy methylated glycouril. For further example, Formula 6 represents a structure of a triazene.

In some embodiments, the first crosslinkable polymer 404 may include a crosslinkable functional group 406 substantially similar to a crosslinkable functional group discussed above with respect to the crosslinking agent 400. In some embodiments, the first crosslinkable polymer 404 may also include other functional groups, e.g., a functional group 408 capable of absorbing radiation energy during a lithography exposure process. The second crosslinkable polymer 410 includes a crosslinkable functional group 412 substantially similar to a crosslinkable functional group discussed with reference to FIG. 4A. The chemical structure of each of the first crosslinkable polymer 404 and the second crosslinkable polymer 410 may also include a backbone. The backbone may be a continuous chain created by series of covalently bounded atoms. The backbone may include an acrylic, a polyester, an epoxy novalac, a polysaccharide, a polyether, a polyimide, a polyurethane, and mixtures thereof. One example of a particular crosslinkable polymer structure (e.g., the first crosslinkable polymer 404 and/or the second crosslinkable polymer 410) that may be utilized in the protective layer 210 is illustrated below:

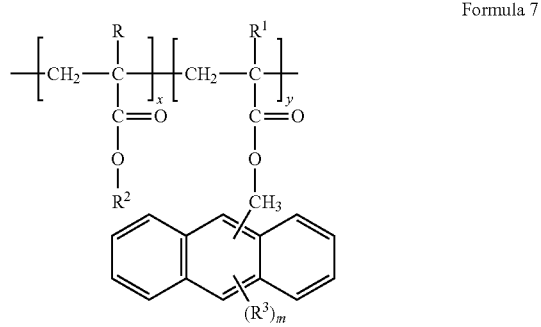

Formula 7

In some embodiments, in Formula 7, each R and $R^1$ may be a hydrogen or a substituted or unsubstituted alkyl group. In some embodiments, Each $R^2$ may be a substituted or unsubstituted alkyl, and each $R^3$ may be a halogen atom.

When a subsequent pre-exposure treatment process is performed to the protective layer 210, which will be described in detail below with reference to FIG. 5, the first crosslinkable polymer 404 and second crosslinkable polymer 410 may be cross-linked by reactions between the crosslinkable polymers and the crosslinking agent 400. For example, the crosslinkable functional group 406 of the first crosslinkable polymer 404 may interact with the crosslinkable functional group 402 of the crosslinking agent 400. For further example, the crosslinkable functional group 412 of the second crosslinkable polymer 410 may interact with the crosslinkable functional group 402 of the crosslinking agent 400.

In some embodiments, the catalyst may be used to initiate a cross-linking reaction between the crosslinkable polymers during the subsequent pre-exposure treatment process. The catalyst may be, e.g., a thermal acid generator, a photoacid generator, a photobase generator, suitable combinations of these, or the like. In an embodiment in which the catalyst is a thermal acid generator, the catalyst will generate an acid when sufficient heat is applied to the protective layer 210. For example, the catalyst may include amine that quench the acidity of an acid functional group, and an acid is generated after amine evaporates when the protective layer 210 is heated. Below are some exemplary formulas of a catalyst:

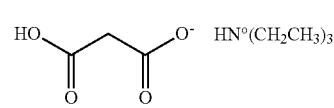

Formula 8

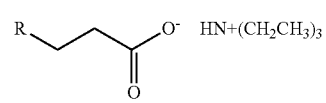

Formula 9

In Formula 9, R may be an alkyl group with hydrogen attached to hydrocarbon with straight, branched, or cyclic structure. In some embodiments, the alkyl group may also contain heteroatom. For example, the alkyl group may contain nitrogen or oxygen.

It is noted that in some alternative embodiments, the protective layer 210 may not include a crosslinkable polymer, a crosslinking agent, and/or a catalyst. In the alternative embodiments, the protective layer 210 may not be cross-linked under a subsequent pre-exposure treatment process.

In some embodiments, the protective layer 210 may include a chelating agent. In some embodiments, the chelating agent includes an electron donating group such as amine, alkoxy, alkane, hydroxyl, aromatic, and/or an amide type functional group. In some embodiments, the chelating agent includes an electron acceptor group such as ketone, aldehyde, carboxylic acid, ester, acyl halide, andydride, nitrile, sulfone, sulfoxide, and nitro type functional group. Below are some exemplary formulas of the electron donating groups:

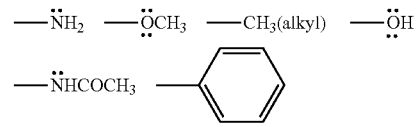

Below are some exemplary formulas of the electron acceptor groups:

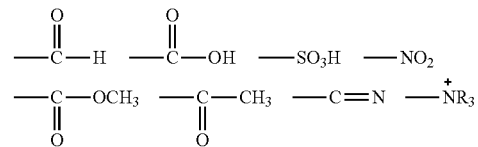

Examples of the chelating agent include crown ether, cryptand, other suitable chelating agents, and/or a combination thereof. The chelating agent of the protective layer 210 may be capable of binding to ions, which may be used to trap ions diffused from a neighboring layer (e.g., the first photoresist layer 208 and/or the second photoresist layer 212), thereby reducing ionic additives (e.g. an ionic PAG, an ionic PDQ) diffusion of the neighboring layer (e.g., the first photoresist layer 208 and/or the second photoresist layer 212).

In some embodiments, the concentration of the chelating agent in the protective layer 210 and the molecular weight of the chelating agent may be designed according to the compositions of the first photoresist layer 208 and the second photoresist layer 212. In some embodiments, the concentration of the chelating agent in the protective layer 210 may be adjusted according the concentration of ionic additives (e.g., an ionic PAG, an ionic PDQ) in the first photoresist layer 208 and/or the second photoresist layer 212. In an example, the concentration of the chelating agent may be increased if the concentration of ionic additives in the photoresist layers is high. In an example, the protective layer 210 may have a concentration of the chelating agent in a range of between about 0.01% and 10% by weight. In another example, the protective layer 210 may have a concentration of the chelating agent that is the same or is similar to a concentration of ionic additives in the first photoresist layer 208 and/or the second photoresist layer 212. For example, the protective layer 210 may have a chelating agent concentration of about 10% by weight where the first photoresist layer 208 has an ionic additives concentration of about 10% by weight. For further example, the protective layer 210 may have a concentration of the chelating agent of about 10% by weight, where the second photoresist layer 212 has a concentration of ionic additives of about 10% by weight.

In some embodiments, the molecular weight of the chelating agent may be adjusted according the concentration of ionic additives (e.g., an ionic PAG, an ionic PDQ) in the first photoresist layer 208 and the second photoresist layer 212. In some embodiments, the chelating agent forms a complex with an ion generally on an equimolecular basis, and the higher the molecular weight of the chelating agent, the higher the quantity of the chelating agent may be desired to chelate the ion. In an example, a chelating agent with a smaller molecular weight may be chosen if the concentration of ionic additives in the photoresist layers is high. In an example, the chelating agent has a molecular weight ranging between 100 and 2000.

It is noted that the concentration and the molecular weight of the chelating agent discussed above are exemplary only and not intended to be limiting beyond what is specifically recited in the claims that follow. It will be understood by those skilled in the art that various combination of concentration and molecular weight of the chelating agent may be used in the protective layer 210. In an embodiment, the protective layer 210 may include a chelating agent of a lower concentration and a smaller molecular weight. In another embodiment, the protective layer 210 may include a chelating agent of a higher concentration and a larger molecular weight.

In some embodiments, the protective layer 210 may include a functional group providing for the developer solubility control. In some embodiments, the functional group may include a base labile functional group including Allyl ether, Ac—OR, Ac—NR$_2$, Pv-OR, N, N-Dimethylhydrazone, carboxylic acid, phenol (carbolic acid), other suitable base labile function groups, and/or a combination thereof. The chemical formulas for some of the base labile function groups are provided below:

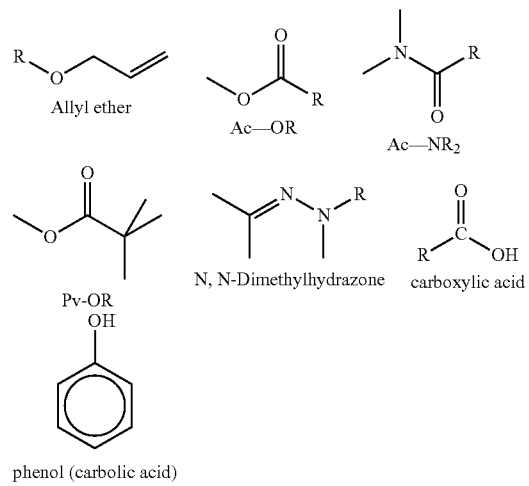

In some embodiments, the protective layer 210 may be soluble in a TMAH developer. In one example, the TMAH developer includes a TMAH solution with a proper concentration ranging about between 0 and 15% by weight. In another one example, the TMAH developer includes a 2.38% by weight TMAH solution.

In some embodiments, the protective layer 210 is insensitive to radiation energy used in the subsequent first lithography exposure process 700 and the second lithography exposure process 800 described below with reference to FIGS. 7A-8D. In some embodiments, the protective layer 210 may be designed according the design requirements of the exposure dose to the first photoresist layer 208 by absorbing partially the exposing beam projected on the second photoresist layer 212, which will be discussed in detail below with reference to FIGS. 9A-9E.

The protective layer 210 may be formed by spin-on coating or low temperature deposition without damage to the underlying first photoresist layer 208. In an example, the protective layer 210 is deposited by spin-on coating. In another example, the protective layer 210 is formed by a low temperature deposition, such as CVD at low temperature.

Referring now to FIG. 1, in an embodiment, the method 100 then proceed to block 108, where a pre-exposure treatment process is applied to the protective layer 210. Usually initiated by heat, pressure, or radiation, crosslinks are formed in the protective layer 210 by chemical reactions of the crosslinking agent and the crosslinkable polymers in the protective layer 210. In some embodiments, the crosslinking agent can create a covalent bond with the crosslinkable polymers. In some embodiments, various polymer structures may be formed. In an example, a linear polymer structure may be formed. In another example, a branched polymer structure may be formed. In yet another example, a cyclic structure may be formed. The cross-linked protective layer 210 may include larger molecule polymers, thereby reducing the intermixing of the first photoresist layer 208, the protective layer 210, and/or the second photoresist layer 212.

Figure 5:
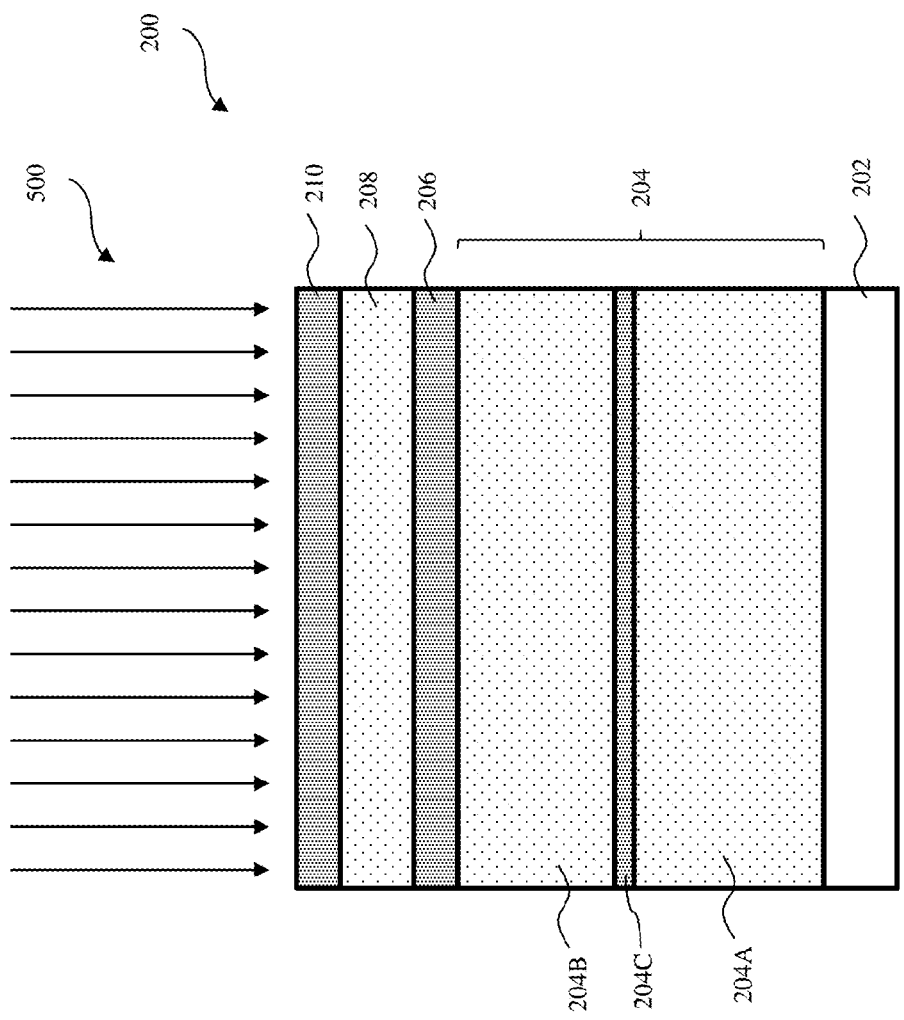
FIG. 5 is a cross-sectional view of a semiconductor device where a pre-exposure treatment process is performed according to some embodiments.

In some embodiments, for example, in the example of FIG. 5, the protective layer 210 is treated with electromagnetic waves 500 to form crosslinks. The electromagnetic waves may include radio waves, microwaves, infrared, visible light, ultraviolet, other suitable electromagnetic waves, or a combination thereof. In an example, the treatment time is between 1 and 100 seconds. In another example, the treatment time is between 5 and 30 seconds. In some embodiments, the protective layer 210 is heated to a cross-linking temperature (cure temperature), thereby forming crosslinks in the protective layer 210. In an example, the cross-linking temperature (cure temperature) ranges between about 22° C. and 350° C. In another example, the cross-linking temperature is about 150° C. When properly treated, the cross-linking agent reacts with the crosslinkable polymers in the protective layer 210, bonding and cross-linking the individual crosslinkable polymers into larger molecule polymers.

In some embodiments, the cross-linked protective layer 210 is not soluble in a solvent of the second photoresist layer 212 that will be disposed on the treated protective layer 210. In an example, the cross-linked protective layer 210 has a dissolution rate of less than 5 angstroms per second in the solvent of the second photoresist layer 212.

Figure 6:
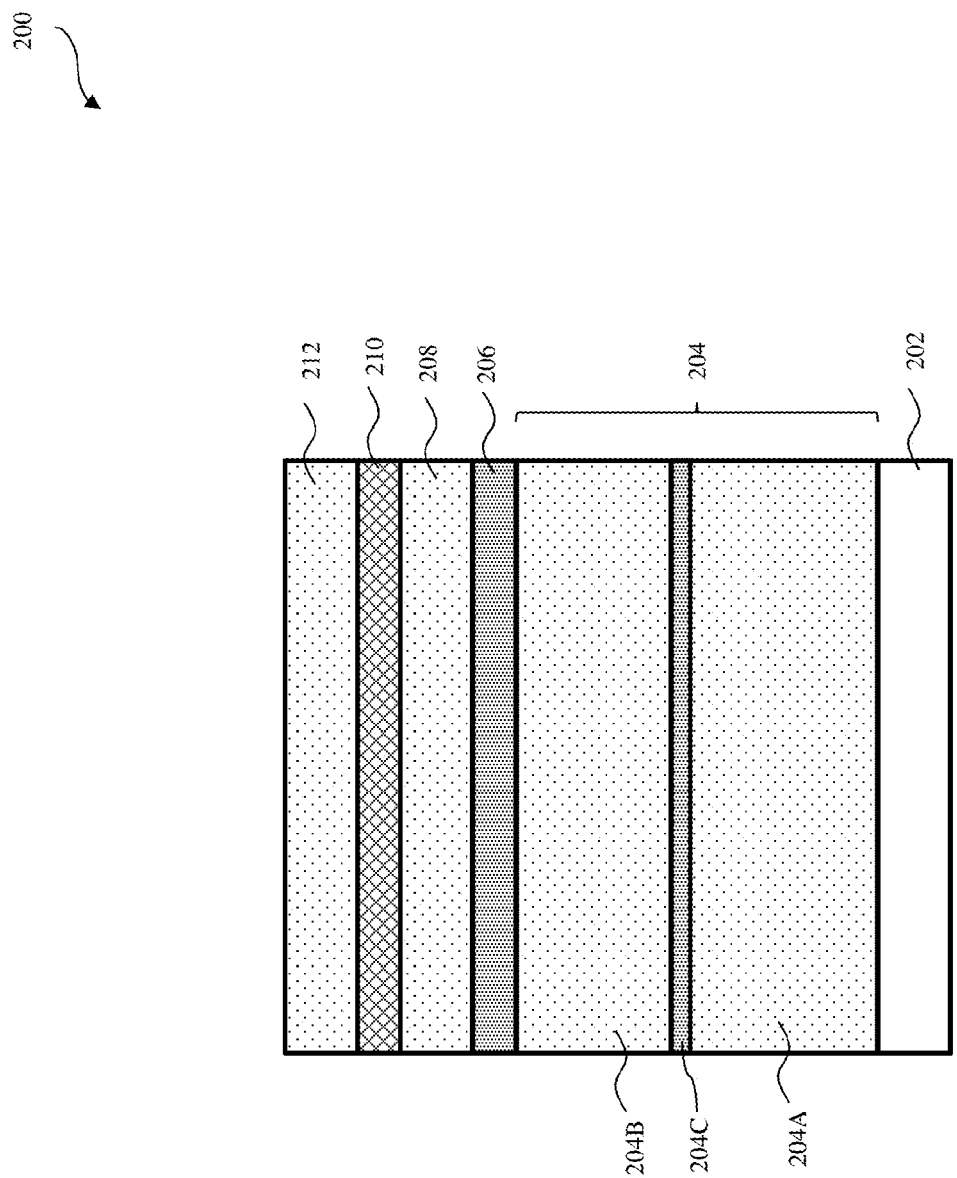
FIG. 6 is a cross-sectional view of a portion of a semiconductor device after forming a second photoresist layer on the protective layer according to some embodiments.

Referring now to FIG. 1 and FIG. 6, in an embodiment, the method 100 then proceed to block 110, where a second photoresist layer 212 is formed on the protective layer 210 by depositing a second photoresist composition on the protective layer 210. The second photoresist layer 212 may include a photoresist material and a solvent. In some embodiments, the photoresist material includes a chemical amplification (CA) resist material. In some embodiments, the second photoresist layer 212 may further include quencher and/or other additives.

In some embodiments, the CA resist material of the second photoresist layer 212 may be a positive CA resist material, which includes an acid cleavable polymer that turns soluble in a developer such as a base solution after the acid cleavable polymer is cleaved by an acid (e.g., generated by PAG). In an example, the acid cleavable polymer cleaved by the acid is soluble in a TMAH developer. In another example, the TMAH developer includes a TMAH solution with a proper concentration ranging about between 0 and 15% by weight. In yet another example, the TMAH developer includes a TMAH solution with a concentration of about 2.38% by weight. In furtherance of the embodiments when the CA resist material is used, the photoresist material of the second photoresist layer 212 includes a PAG. When absorbing photo energy, the PAG decomposes and forms a small amount of acid. The PAG may have a concentration ranging between about 1% and 30% by weight of the second photoresist layer 212. In some embodiments, the PAG can be ionic type (onium salt), such as metallic or sulfonate. The PAG may alternatively be non-ionic, such as sulfonate ester, 2 nitrobenzyl ester, organohalide, aromatic sulfonate, oxime sulfonate, N-sulfonyloxyimide, sulfonloxy ketone, or diazonaphthoquinone (DNQ) 4 sulfonate.

The second photoresist layer 212 may additionally include other components, such as a quencher. In an example, the quencher is base type and is capable of neutralizing acid. Collectively or alternatively, the quencher may inhibit other active components of the second photoresist layer 212, such as inhibiting photoacid from reaction. Examples of optional additives further include photo decomposable quencher (PDQ), photo base generator (PBG) that may be used to inactivate acid generated by exposure, thermal base generator, thermal acid generator, acid amplifier, chromophore, other suitable materials, and/or a combination thereof.

In some embodiments, the second photoresist layer 212 does not include a crosslinking agent and/or crosslinkable polymers, and the second photoresist layer 212 is not cross-linked under a subsequent pre-exposure treatment process.

In some embodiments, the second photoresist layer 212 may be formed by spin-on coating or other suitable technique. Other steps, such as baking, may follow the coating of the second photoresist layer 212. In some embodiments, the solvent of the second photoresist layer 212 may be partially evaporated by a soft baking process.

The first photoresist layer 208 and the second photoresist layer 212 may have similar or different compositions from each other, according to various embodiments. In one embodiment, the first photoresist layer 208 and the second photoresist layer 212 include different materials, which may be exclusively dissolved in separate, respective developers. Specifically, a first developer may be used to develop the first photoresist layer 208 and a second developer may be used to develop the second photoresist layer 212. The first developer is different from the second developer. The first photoresist layer 208 is soluble in the first developer but insoluble in the second developer. The second photoresist layer 212 is soluble in the second developer but insoluble in the first developer. In some embodiments, the protective layer 210 is soluble in both the first developer and the second developer. Alternatively, in some embodiments, the protective layer 210 is insoluble in either one or both of the first and second developers.

In some embodiments, the first photoresist layer 208 and the second photoresist layer 212 include different materials that may be dissolved in a same developer. Specifically, the same developer may be used to develop the first photoresist layer 208 and the second photoresist layer 212. In some embodiments, the protective layer 210 may be dissolved in the same developer. For example, the developer includes a TMAH solution with a proper concentration ranging about between 0 and 15% by weight. For further example, the developer includes a TMAH solution with a concentration of about 2.38% by weight.

The second photoresist layer 212 may be formed by spin-on coating or other suitable techniques. Other steps, such as baking, may follow the coating of the second photoresist layer 212.

Figure 7B:
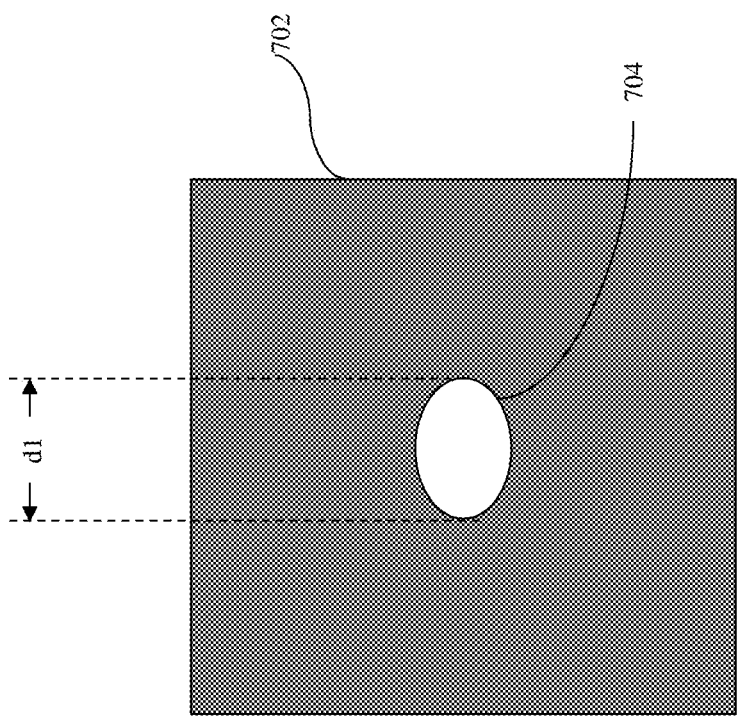
FIG. 7B is a top view of a photomask used in the example of FIG. 7A according to some embodiments.

Referring now to FIG. 1 and the example of FIGS. 7A-7B, in an embodiment, the method 100 then proceeds to block 112, where a first lithography exposure process 700 is performed simultaneously to the first photoresist layer 208 and the second photoresist layer 212. Referring to the example of FIG. 7A, the first lithography exposure process 700 is implemented using a photomask (mask or reticle) 702 having a first pattern 704 to simultaneously expose both the first photoresist layer 208 and the second photoresist layer 212, thereby forming latent patterns in the first and second photoresist layers respectively. A latent pattern is referred to as a portion of the photoresist layer that is exposed but not developed yet. In some embodiments, during the first lithography exposure process 700, the first pattern 704 is imaged to the first photoresist layer 208 and the second photoresist layer 212.

In some embodiments, during the first lithography exposure process 700, the first photoresist layer 208 is exposed to a radiation energy that has an exposure dose 706a through the photomask 702, thereby forming a bottom latent pattern 708. After the first lithography exposure process 700 is performed, the first photoresist layer 208 includes a bottom pattern 708.

In some embodiments, during the first lithography exposure process 700, the second photoresist layer 212 is exposed to radiation energy of an exposure dose 706b through the photomask 702, thereby forming a first top latent pattern 714. After the first lithography exposure process 700 is performed, the second photoresist layer 212 includes a first top latent pattern 714. In some embodiments, the second photoresist layer 212 is exposed to the radiation energy with an exposure dose 706b during the same time period that the first photoresist layer 208 is exposed to the radiation energy with an exposure dose 706a.

In some embodiments, one or both of the protective layer 210 and the second photoresist layer 212 may partially absorb radiation from the exposing beam through the photomask 702, and only a portion of the radiation from the exposing beam reaches the first photoresist layer 208. Therefore, the exposure dose 706a to which the first photoresist layer 208 is exposed may be less than the exposure dose 706b to which the second photoresist layer 212 is exposed. The difference of exposure doses 706a and 706b will be discussed in detail below with reference to FIGS. 9A-9E.

Referring now to the example of FIG. 7B, a top view of the photomask 702 used in the first lithography exposure process 700 is illustrated. The photomask 702 includes a first pattern 704, which has an oval shape in the top view. The first pattern 702 has a width of d1 in the X direction. In some embodiments, both the bottom latent pattern 708 and the first top latent pattern 714 include latent images of the same first pattern 704, therefore may be related. For example, the bottom latent pattern 708 may be associated with a via feature defined by the first pattern 704. For further example, the first top latent pattern 714 is associated with a via-connecting portion of a metal line. The via-connecting portion of the metal line may be connected to the via feature. The metal line may be defined by a second pattern defined in a second photomask used in a second lithographic exposure process 800, which will be discussed in detail below with reference to FIGS. 8A-8D.

The first lithography exposure process 700 may be of various types as known in the art, including exposure systems that utilize krypton fluoride (KrF) excimer lasers, argon fluoride (ArF) excimer lasers, ArF immersion lithography, or EUV. Other operations, such as post-exposure-baking (PEB), may follow the lithography exposure process 700.

Referring now to FIG. 1, in an embodiment, the method 100 then proceed to block 114, where a second lithography exposure process 800 is performed simultaneously to the first photoresist layer 208 and the second photoresist layer 212. Referring to the example of FIG. 8A, the second lithography exposure process 800 is implemented using a photomask 802 having a second pattern 804.

While the second lithography exposure process 800 is performed simultaneously to the first photoresist layer 208 and the second photoresist layer 212, in some embodiments, the second pattern 804 is only imaged to the second photoresist layer 212, and is not imaged to the first photoresist layer 208. In other words, in some embodiments, during the second lithography exposure process 800, while an additional latent pattern may be formed in the second photoresist layer 212, no additional latent pattern is formed in the first photoresist layer 208.

In some embodiments, during the second lithography exposure process 800, regions 808 of the first photoresist layer 208 receive radiation energy of an exposure dose 806 through the photomask 802. However, because the exposure dose 806a may be less than an exposure threshold of the first photoresist layer 208, the second lithography exposure process 800 may not result in any additional exposed regions in the first photoresist layer 208. As illustrated in FIG. 8A, regions 808 remain unexposed after receiving the exposure dose 806a.

In some embodiments, during the second lithography exposure process 800, the second photoresist layer 212 receives radiation energy of an exposure dose 806b through the photomask 802, thereby forming a second top latent pattern 814. After the second lithography exposure process is performed, the second photoresist layer 212 includes a top latent pattern 812. The top latent pattern 812 includes the first top latent pattern 714 that has been formed by first lithography exposure process 700 and the second top pattern 814 formed by the second lithography exposure process 800. In some embodiments, the second photoresist layer 212 is exposed to the radiation energy with an exposure dose 806b during the same time period that the first photoresist layer 208 is exposed to the radiation energy with an exposure dose 806a.

Exposure thresholds of the first photoresist layer 208 and the second photoresist layer 212, and exposure doses 806a and 806b received by the photoresist layers respectively will be discussed in detail with reference to FIGS. 9A-9E below.

Referring now to FIG. 8B, a top view of the photomask 802 used in the second lithography exposure process 800 is illustrated. The photomask 802 includes a second pattern 804, which has a rectangular shape in the top view. The second pattern 804 has a width of d2 in the X direction. In some embodiments, the top latent pattern 812 is associated with a metal line feature defined by the second pattern 804 of the photomask 802.

Figure 8D:
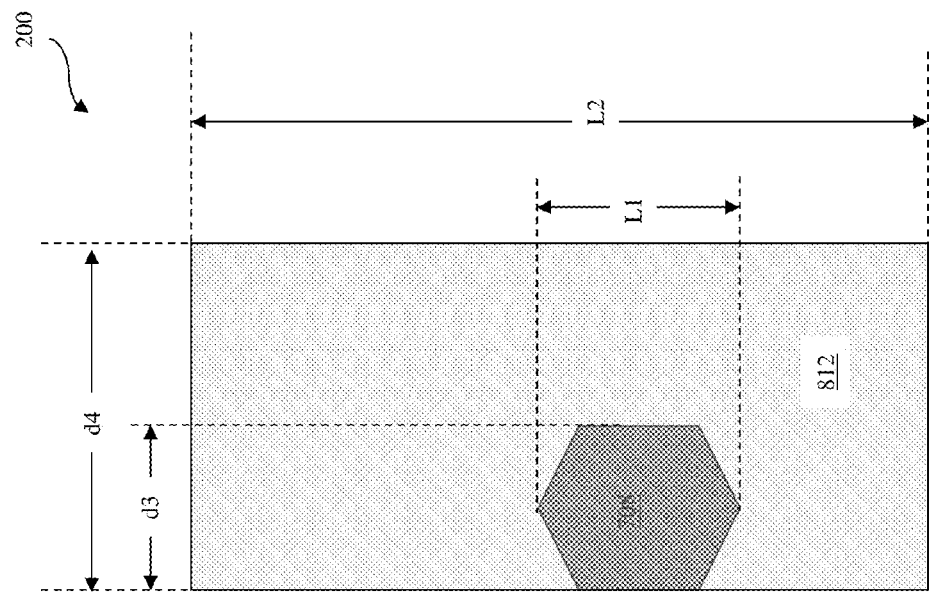
FIGS. 8C-8D are top views of a portion of a semiconductor device after a first lithography exposure process and a second lithography exposure process are performed according to some embodiments.
Figure 8C:
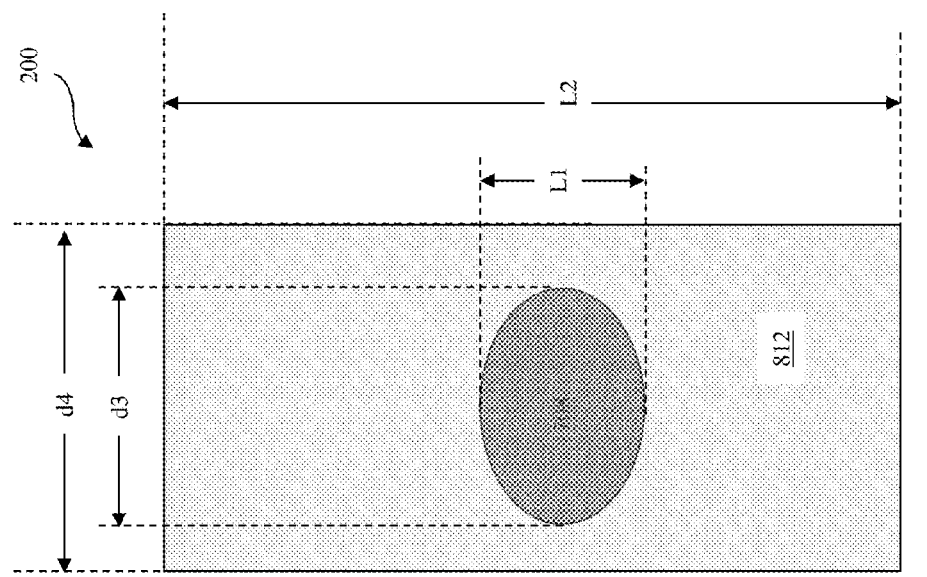

FIGS. 8C-8D are top views of the bottom latent pattern 708 and the top latent pattern 812 illustrated together for better illustrating the spatial relationship there-between. In some embodiments, the bottom latent pattern 708 and the top latent pattern 812 are intrinsically related, because the first top latent pattern 714 of the top latent pattern 812 and the bottom latent pattern 708 are imaged simultaneously in the lithography exposure process 700 using the first pattern 704 of the photomask 702. As illustrated in FIG. 8C, in one example, the bottom latent pattern 708 has an oval shape in the top view having a first width of d3 in the X direction and a second width of L1 in the Y direction. The top latent pattern 812 has a rectangular shape in the top view having a width of d4 in the X direction, and a length of L2 in the Y direction and a width of d4. In an embodiment, d3 is less than d4, and L1 is less than L2. In some embodiments, the top view of the bottom latent pattern 708 at least partially overlaps the top latent pattern 812. In some embodiments, the top view of the top latent pattern 812 completely covers the top view of the bottom latent pattern 808. In an example, the center of the bottom latent pattern 708 aligns with the center of the top latent pattern 812 in the X direction. In some examples, the center of the bottom latent pattern 708 aligns with the center of the top latent pattern 812 in the Y direction. As illustrated in FIG. 8D, in some examples, the bottom latent pattern 708 has a polygon shape in the top view. In some examples, the center of the bottom latent pattern 708 does not align with the center of the top latent pattern 812 in the X direction. In some examples, a sidewall of the bottom latent pattern 708 vertically aligns with a sidewall of the top latent pattern 812.

It is noted that the configurations, including the relative sizes and positions, of the bottom latent pattern 708 and the top latent pattern 812 illustrated in FIGS. 8A-8D are exemplary only and not intended to be limiting beyond what is specifically recited in the claims that follow. It will be understood by those skilled in the art that other configurations may be used. The bottom latent pattern 708 and the top latent pattern 812 may have the same shape or have different shapes. Any shape may be used for either the bottom latent pattern 708 or the top latent pattern 812. In some embodiments, the center of the bottom latent pattern 708 and the center of the top latent pattern 812 are substantially aligned in either the X direction or the Y direction. In some embodiments, the center of the bottom latent pattern 708 and the center of the top latent pattern 812 are not aligned in either the X direction or the Y direction. In some embodiments, the bottom latent pattern 708 has a top surface area that is smaller than a top surface area of the top latent pattern 812.

In some embodiments, because the bottom latent pattern 708 and the top latent pattern 812 are intrinsically related, the features (e.g., a via feature and a metal line feature respectively) associated with the bottom latent pattern 708 and the top latent pattern 812 may be similarly intrinsically and spatially related to each other in terms of geometry (shape and size), which will be discussed in detail with reference to FIGS. 11G-11H below.

The second lithography exposure process 800 may be of various types as known in the art, including exposure systems that utilize krypton fluoride (KrF) excimer lasers, argon fluoride (ArF) excimer lasers, ArF immersion lithography, or EUV. In some embodiments, the first lithography exposure process 700 and the second lithography exposure process 800 may use the same type of exposure systems. Alternatively, the first lithography exposure process 700 and the second lithography exposure process 800 use different types of exposure systems.

The exposing sources for the first lithography exposure process 700 and the second lithography exposure process 800 may be UV, DUV, EUV, or charged particles, such as electron-beam, respectively. In some embodiments, the first lithography exposure process 700 and the second lithography exposure process 800 may use the same exposure source (e.g., exposure source with the same wavelength). Alternatively, the first lithography exposure process 700 and the second lithography exposure process 800 may use different exposure sources (e.g., exposure sources with different wavelengths). In some embodiments, charged particles are used as exposing beam during the lithography exposure processes. In this case, the IC design pattern may be defined in a data file and the sensitive resist material is chosen to be sensitive to the charged particles, such as e-beam.

Other operations, such as post-exposure-baking (PEB), may follow the second lithography exposure process 800.

It is noted that in some embodiments, the second lithography exposure process 800 using the photomask 802 having a second pattern 804 may be performed before the first lithography exposure process 700 using the photomask 702 having a first pattern 704. For example, during the second lithography exposure process 800, a top latent pattern 812 in the second photoresist layer 212 may be formed before any latent pattern is formed in the first photoresist layer 208. During the subsequent first lithography exposure process 700, a bottom latent pattern 708 may be formed in the first photoresist layer 208.

In some embodiments, the IC design patterns may have specific design requirements regarding exposure doses received by the photoresist layers and exposure thresholds of the photoresist layers, which will be described below with reference to the examples of FIGS. 9A-9E.

In some embodiments, different materials are used in the first photoresist layer 208 and the second photoresist layer 212 respectively. Various embodiments where different materials are used in the first photoresist layer 208 and the second photoresist layer 212 are described with reference to FIGS. 9A-9C. Referring now to the example of FIG. 9A, examples of dissolution curves of two photoresist layers of different materials in a developer as a function of exposure dose is provided. Dissolution curve 902 illustrates the dissolution rate of the first photoresist layer 208 of a first material as a function of exposure dose received by the first photoresist layer 208. Dissolution curve 904 illustrates the dissolution rate of the second photoresist layer 212 of a second material as a function of exposure dose received by the second photoresist layer 212. In some embodiments, both the first photoresist layer 208 and the second photoresist layer 212 include positive photoresists. In some embodiments, the first material is different from the second material.

Figure 9A:
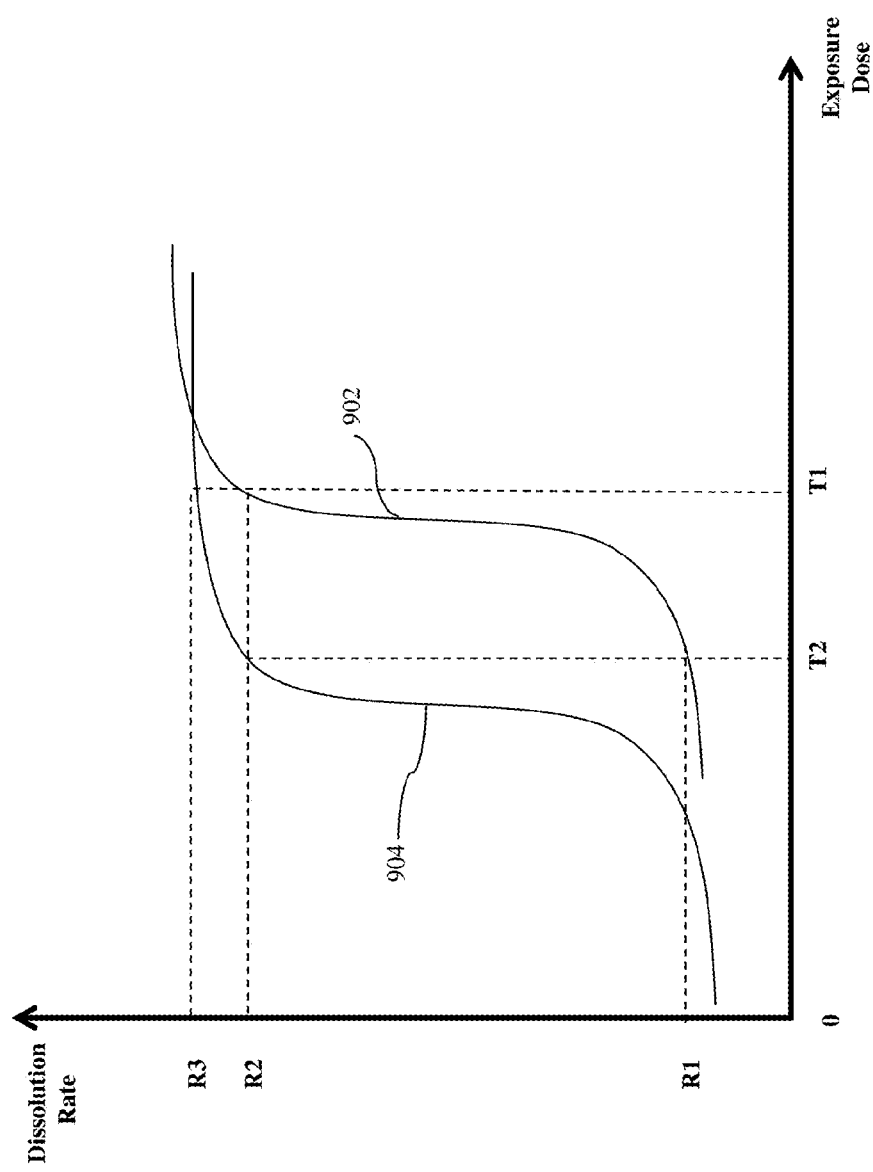
FIGS. 9A and 9D are graphs illustrating dissolution rates of two photoresist layers as a function of exposure dose according to various embodiments.

As illustrated in FIG. 9A, in some embodiments, the first photoresist layer 208 has a first exposure threshold T1, and the second photoresist layer 212 has a second exposure threshold T2. For a particular photoresist, when the exposure dose is equal to or greater than its exposure threshold, the corresponding portion of the photoresist is chemically changed such that a latent pattern is formed, and the latent pattern will be developed (e.g., it is removed by the developer when the photoresist is positive tone) in a developing process. When the exposure dose is less than the exposure threshold, the corresponding portion of the photoresist is not chemically changed (e.g., no latent pattern is formed, and it remains during the developing process when the photoresist is positive tone). It is understood that the term "chemically changed" means that the photoresist has sufficiently changed to respond differently, e.g., as exposed positive-tone photoresist responds in the development process. In one example where the photoresist is positive tone, only portions of the photoresist exposed with an exposure dose equal to or greater than the exposure threshold are removed by a suitable developer during the developing process. Other portions of the photoresist exposed with an exposure dose less than the exposure threshold remain after the developing process.

As shown in the example of FIG. 9A, in some embodiments, the first exposure threshold T1 is greater than the second exposure threshold T2. As shown in the dissolution curves 902 and 904, initially, the unexposed materials of the first photoresist layer 208 and the second photoresist layer 212 have dissolution rates less than R1, and are practically insoluble in the developer. As the exposure dose increases and reaches T2, the exposed regions of the second photoresist layer 212 are chemically changed, form a latent pattern, and become soluble in the developer at a dissolution rate R2. On the other hand, because the exposed regions of the first photoresist layer 208 receive an exposure dose (e.g., T2) less than its exposure threshold T1, the exposed regions of the first photoresist layer 208 are not chemically changed. As such, no latent pattern is formed in the first photoresist layer 208, and the exposed regions of the first photoresist layer 208 are practically insoluble in the developer at a dissolution rate R1.

Also as shown in the example of FIG. 9A, when the exposure dose further increases and reaches T1, exposed regions in both the first photoresist layer 208 and the second photoresist layer 212 have dissolution rates equal to or higher than R2 and are soluble in the developer. As such, latent patterns are formed in both the first photoresist layer 208 and the second photoresist layer 212 when the exposure dose reaches T1.

Figure 9B:
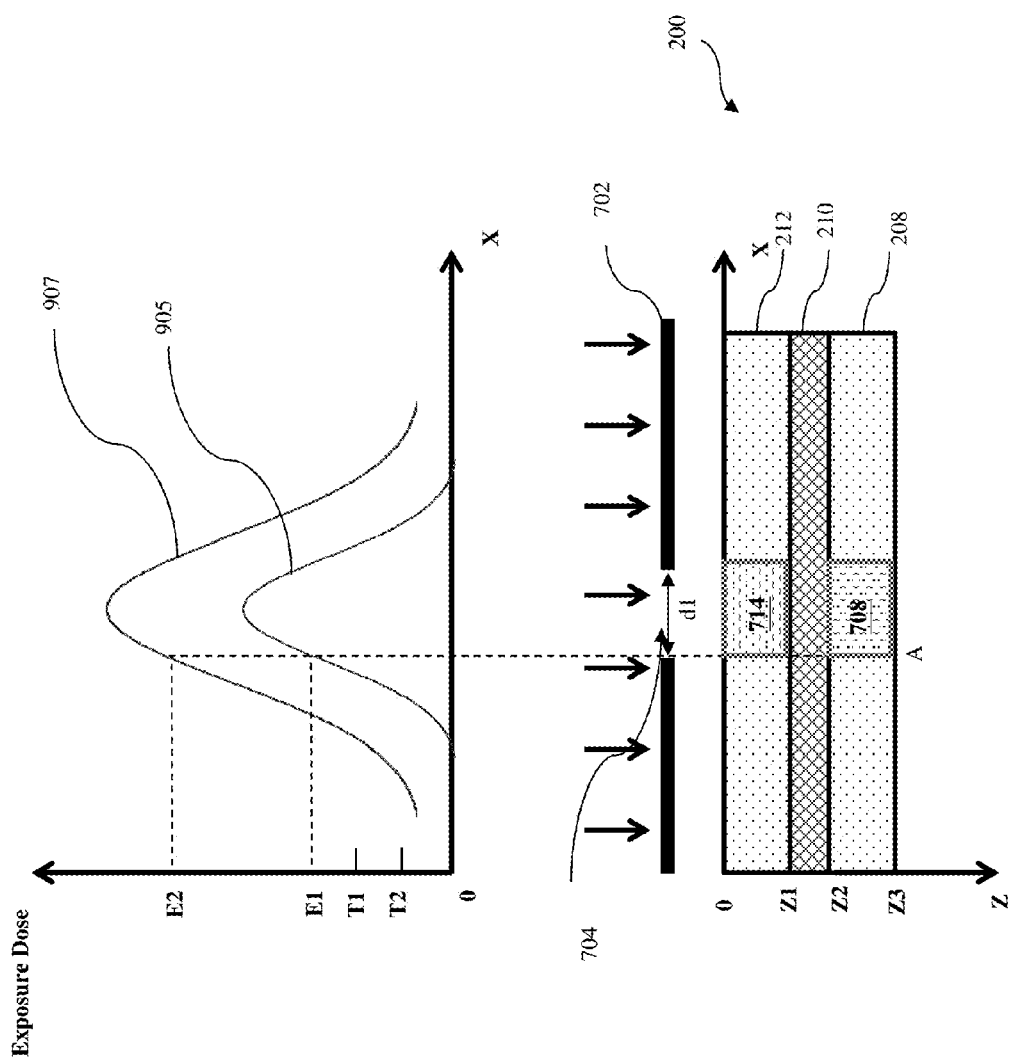

Referring now to FIG. 9B, illustrated are examples of exposure dose curves of the first photoresist layer 208 and the second photoresist layer 212 during the first lithography exposure process 700. As illustrated in FIG. 9B, curve 905 illustrates an exposure dose curve of the first photoresist layer 208 during the first lithography exposure process 700.

In an example, curve 905 corresponds to the exposure dose 706a to which the first photoresist layer 208 is exposed during the first lithography exposure process 700 as illustrated in FIG. 7A. In an example, curve 905 illustrates an exposure dose curve of the bottom surface (at Z3 in the Z direction) of the first photoresist layer 208. As illustrated in FIG. 9B, during the first lithography exposure process 700, in some embodiments, regions of the first photoresist layer 208 closer to the center of the first pattern 704 may receive higher exposure doses than regions farther from the center of the first pattern 704 (e.g., regions near line A). According to curve 905, the lowest exposure dose received by regions 708 of the first photoresist layer 208 (e.g., along line A) is E1. In some embodiments, as illustrated in FIG. 9B, E1 is greater than the exposure threshold T1 of the first photoresist layer 208, such that a bottom latent pattern 708 in the first photoresist layer 208 is formed during the first lithography exposure process 700.

In some embodiments, curve 907 illustrates an exposure dose curve of the second photoresist layer 212 during the first lithography exposure process 700. In an example, curve 907 corresponds to the exposure dose 706b to which the second photoresist layer 212 is exposed during the first lithography exposure process 700 as illustrated in FIG. 7A. In an example, curve 907 illustrates the exposure dose curve of the bottom surface (at Z1 in the Z direction) of the second photoresist layer 212. According to curve 907, the lowest exposure dose received by regions 714 of the second photoresist layer 212 (e.g., along line A) is E2. In some embodiments, as illustrated in FIG. 9B, E2 is greater than the exposure threshold T2 of the second photoresist layer 212, such that a first top latent pattern 714 in the second photoresist layer 212 is formed during the first lithography exposure process 700. In some embodiments, E2 is greater than E1.

Referring now to FIG. 9C, examples of exposure dose curves of the first photoresist layer 208 and the second photoresist layer 212 during the second lithography exposure process 800 using the second photomask 802 are illustrated. In some embodiments, curve 906 illustrates the exposure dose curve of the first photoresist layer 208. In an example, curve 906 corresponds to the exposure dose 806a to which the first photoresist layer 208 is exposed during the second lithography exposure process 800 as illustrated in FIG. 8A. In an example, curve 906 illustrates the exposure dose curve at the top surface (at Z2 in the Z direction) of the first photoresist layer 208. In the example illustrated in FIG. 9C, according to curve 906, the highest exposure dose received by regions 808 of the first photoresist layer 208 (e.g., the regions along line C) is E3. In some embodiments, E3 is less than the exposure threshold T1 of the first photoresist layer 208, such that no additional latent pattern in the first photoresist layer 208 is formed by the second lithography process 800. For example, regions 808 remain unexposed after the second lithography exposure process 800.

In some embodiments, Curve 908 illustrates the exposure dose curve of the second photoresist layer 212. In an example, curve 908 corresponds to the exposure dose 806b to which the second photoresist layer 212 is exposed during the second lithography exposure process 800. In an example, curve 908 illustrates the exposure dose curve at the bottom surface (at Z1 in the Z direction) of the second photoresist layer 212. During the second lithography exposure process 800, in some embodiments, regions of the photoresist layers 208 and 212 closer to the center of the second pattern 804 (e.g., regions near line B) may receive higher exposure doses than regions farther from the center of the second pattern 804 (e.g., regions near line A). In the example illustrated in FIG. 9C, according to curve 908, the lowest exposure dose received by regions 814 of the second photoresist layer 212 (e.g., the regions along line A) is E4. In some embodiments, E4 is greater than the exposure threshold T2 of the second photoresist layer 212, such that a second top latent pattern 814 is formed in the second photoresist layer 212 by the second lithography process 800. In some embodiments, E3 is greater than E4. Alternatively, in some embodiments, E3 is less than E4.

In some embodiments, a greater difference between the exposure thresholds T1 and T2 may provide more design flexibility. In an example, the difference between T1 and T2 may be greater than about 0.5 mJ/cm$^2$. In another example, T1 is greater than about 2 mJ/cm$^2$.

In some embodiments, various properties (e.g. dimensions, attenuations to the exposure intensity, and/or other properties known in the art) of the first photoresist layer 208, the protective layer 210, and/or the second photoresist layer 212 may affect the exposure dose curves and values of E1, E2, E3, and/or E4. The properties of the first photoresist layer 208, the protective layer 210, and/or the second photoresist layer 212 may be determined according to design specifications. In an example, the first photoresist layer 208 has a thickness ranging between about 40 nm and about 120 nm. In another example, the protective layer 210 has a thickness ranging between about 5 nm and 50 nm. In yet another example, the second photoresist layer 212 has a thickness ranging between about 40 nm and about 120 nm. In yet another example, the protective layer 210 has an attenuation of ranging between 0 and 85% relating to a specific wavelength used in the second lithography exposure process 800. In some embodiments, the exposure sources (e.g., the wavelengths) used in the lithography exposure processes may affect the exposure dose curves and be determined according to design specifications.

Figure 9D:
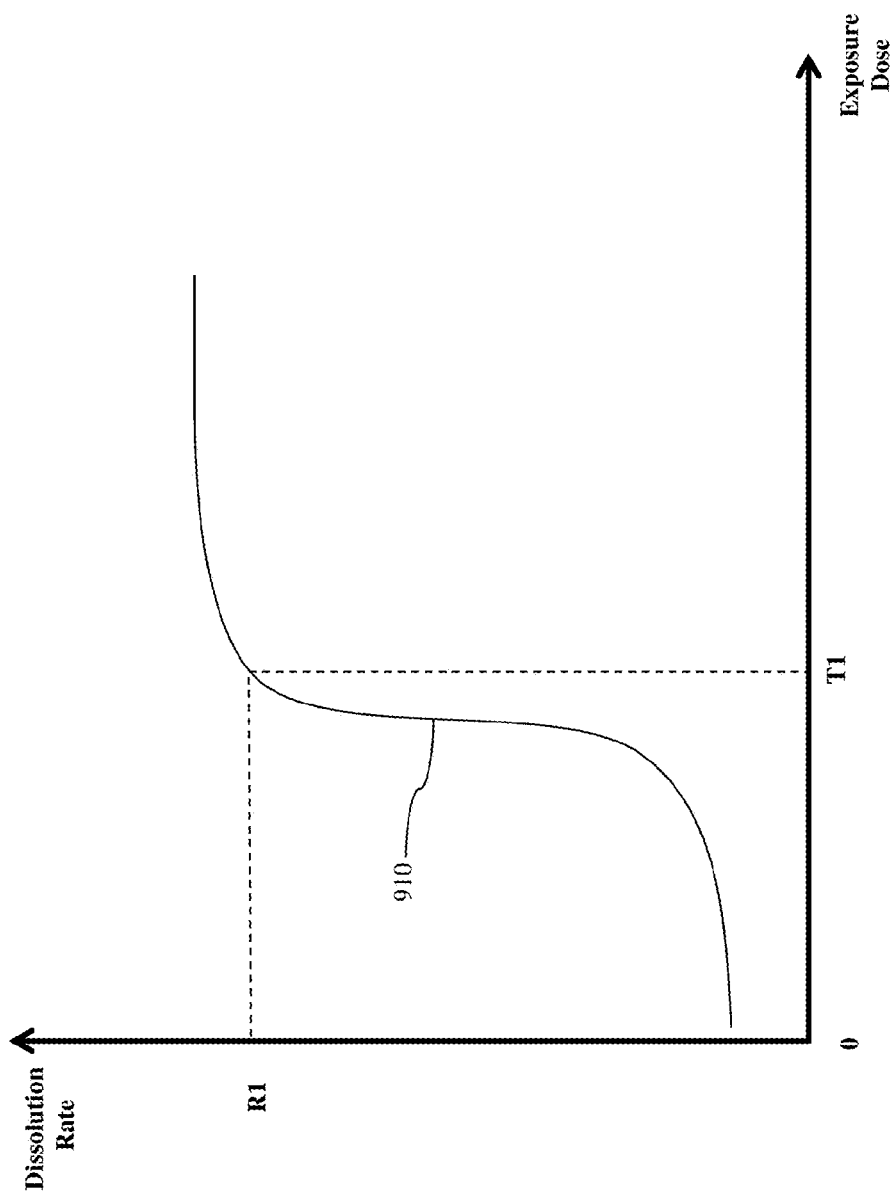

In some embodiments, the same material is used in the first photoresist layer 208 and the second photoresist layer 212. Various embodiments where the same material is used in the first photoresist layer 208 and the second photoresist layer 212 are described with reference to FIGS. 9D-9E. As illustrated in FIG. 9D, in an example, the first photoresist layer 208 and the second photoresist layer 212 may have the same dissolution rate curve 910 and same exposure threshold T1. Referring now to the examples of FIG. 9E, curves 912 and 914 illustrate the exposure dose curves of the first photoresist layer 208 and the second photoresist layer 212 during the second lithography exposure process 800 respectively. In an example, curve 912 illustrates the exposure dose curve of a top surface (at Z2 in the Z direction) of the first photoresist layer 208. According to curve 912, the highest exposure dose received by regions 808 of the first photoresist layer 208 (e.g., the regions along line C) is E3. In an example, curve 914 illustrates the exposure dose curve of a bottom surface (at Z1 in the Z direction) of the second photoresist layer 212. According to curve 914, the lowest exposure dose received by the regions 814 of the second photoresist layer 212 (e.g., along line A) is E4. In some embodiments, during the second lithography exposure process 800, E4 is greater than T1, and E3 is less than T1, such that a second latent pattern 814 is formed in the second photoresist layer 212, and no additional latent pattern is formed (e.g., in regions 808) in the first photoresist layer 208. Various properties may be tuned to meet the design requirements. In some embodiments, the materials of the first photoresist layer 208 and the second photoresist layer 212 are designed to adjust the exposure threshold T1 to meet the design requirements. In an example, T1 is designed to be greater than 2 mJ/cm$^2$. In some embodiments, E3 and E4 are determined by adjusting the exposure dose curves, which may be affected by properties (e.g. dimensions, attenuations to the exposure intensity, and/or other properties known in the art) of the first photoresist layer 208, the protective layer 210, and/or the second photoresist layer 212. In an example, the first photoresist layer 208 has a thickness ranging between about 40 nm and about 60 nm. In another example, the protective layer 210 has a thickness ranging between about 5 nm and 50 nm. In yet another example, the second photoresist layer 212 has a thickness ranging between about 20 nm and about 40 nm. In yet another example, the protective layer 210 has an attenuation in a range of between 0 and 85% relating to a specific wavelength used in the second lithography exposure process 800. In some embodiments, E3 and E4 are determined by adjusting the exposure sources (e.g., the wavelengths used in the lithography exposure processes). In some embodiments, E3 and E4 are determined by adjusting the second pattern 802 (e.g., width d2) defined in second the photomask 802.

It is noted that the dissolution rate curves and the exposure dose curves illustrated in FIGS. 9A-9E are exemplary only and not intended to be limiting beyond what is specifically recited in the claims that follow. It will be understood by those skilled in the art that the lithography exposure process may have different dissolution rate curves and exposure dose curves, and various properties (e.g. dimensions, attenuations to the exposure intensity, and/or other properties known in the art) of the first photoresist layer 208, the protective layer 210 and the second photoresist layer 212, the exposure sources (e.g., the wavelengths used in the lithography exposure processes), and the patterns defined in the photomasks may be tuned to meet various design requirements.

Figure 10:
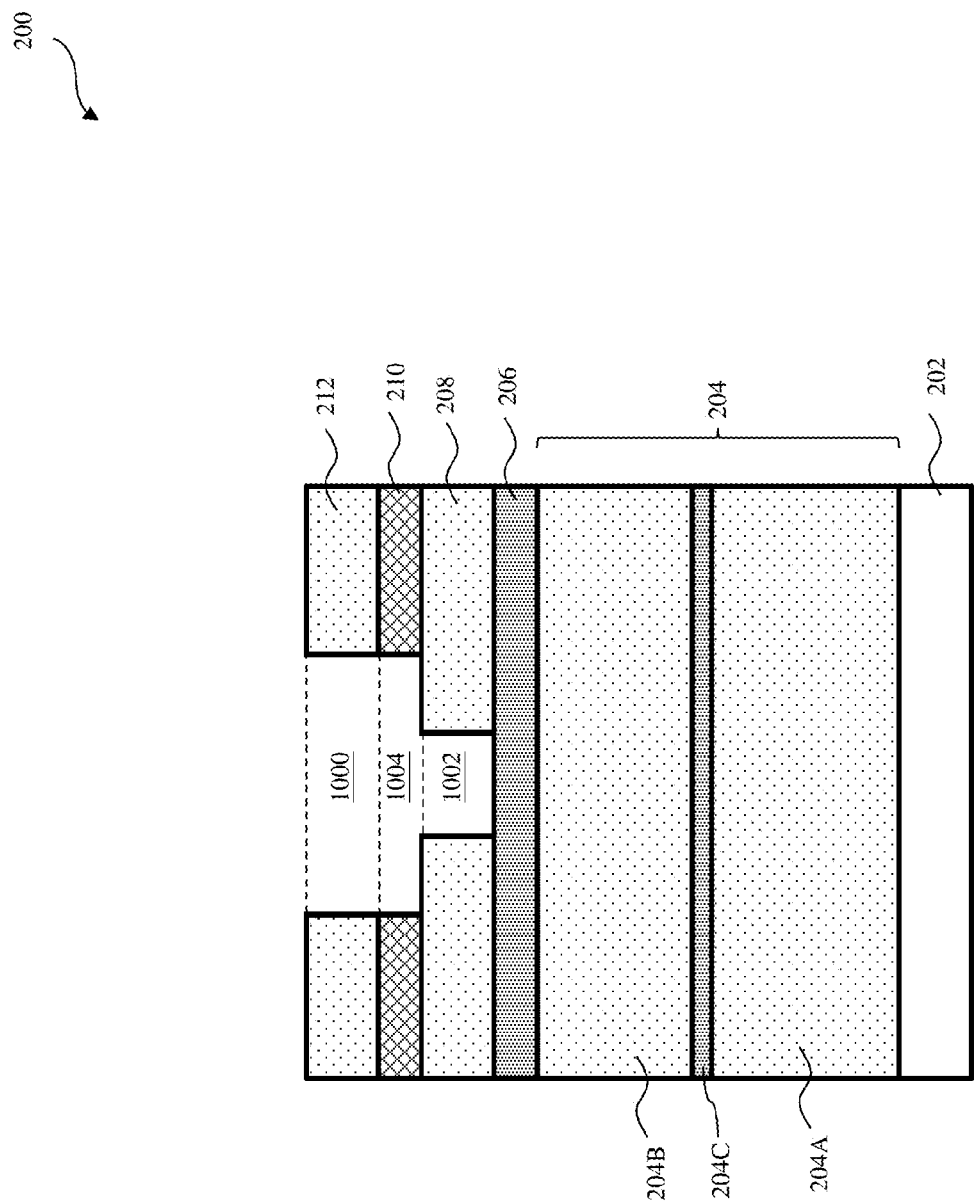
FIG. 10 is a cross-sectional view of a portion of a semiconductor device after performing a developing process to the semiconductor device according to some embodiments.

Referring now to FIG. 1 and the example of FIG. 10, in an embodiment, the method 100 then proceed to block 116, where the first photoresist layer 208, the protective layer 210, and the second photoresist layer 212 are developed to form an opening 1002 in the first photoresist layer 208, an opening 1004 in the protective layer 210, and an opening 1000 in the second photoresist layer 212. In an embodiment, different developers are used to develop the first photoresist layer 208, the protective layer 210, and the second photoresist layer 212 respectively.

Alternatively, in some embodiments, the same developer is used to develop the first photoresist layer 208, the protective layer 210, and the second photoresist layer 212 in a developing process. In some embodiments, the developer includes tetramethyl ammonium hydroxide (TMAH). In one example, the developer includes a TMAH solution with a proper concentration ranging about between 0 and 15% by weight. In another one example, the developer includes a TMAH solution with a concentration of about 2.38% by weight.

In some embodiments, the first photoresist layer 208 and the second photoresist layer 212 include positive tone photoresists. The exposed portions, for example, the top latent pattern 812 and the bottom latent pattern 708 illustrated in FIG. 8A, are removed by a developer, thereby forming a patterned second photoresist layer 212 having an opening 1000 associated with the top latent pattern 812, and forming a patterned first photoresist layer 208 having an opening 1002 associated with the bottom latent pattern 708.

In some embodiments, the patterned second photoresist layer 212 with the opening 1000 is used as an etch mask to remove the portion of the protective layer 210 underlying the opening 1000, thereby forming a patterned protective layer 210 having an opening 1004. In some embodiments, the patterned protective layer 210 may still be immersed in the developer during a time period when the first photoresist layer 212 is being developed. To prevent over etching and ensure the quality of the opening 1004, the dissolution rate of the protective layer 210 is controlled (e.g., by adjusting the protective layer material or the developer). In one example, the dissolution rate of the protective layer 210 is controlled according to various properties of the bottom latent pattern 708 (e.g., the dissolution rate in the developer, the thickness, size, and/or shape). In one example, the dissolution rate of the protective layer 210 in the developer is much lower than the dissolution rate of the bottom latent pattern 708 in the developer. In another example, the dissolution rate of the protective layer 210 is less than 30 nm per second. In yet another example, the dissolution rate of the bottom latent pattern 708 in the developer is about 90% faster than the dissolution rate of the protective layer 210 in the developer.

Other operations, such as hard baking, may follow the developing process.

Referring now to FIG. 1 and FIGS. 11A-11H, in an embodiment, the method 100 then proceeds to block 118, where patterns defined by the openings 1000 and 1002 are transferred to the substrate 202.

Figure 11A:
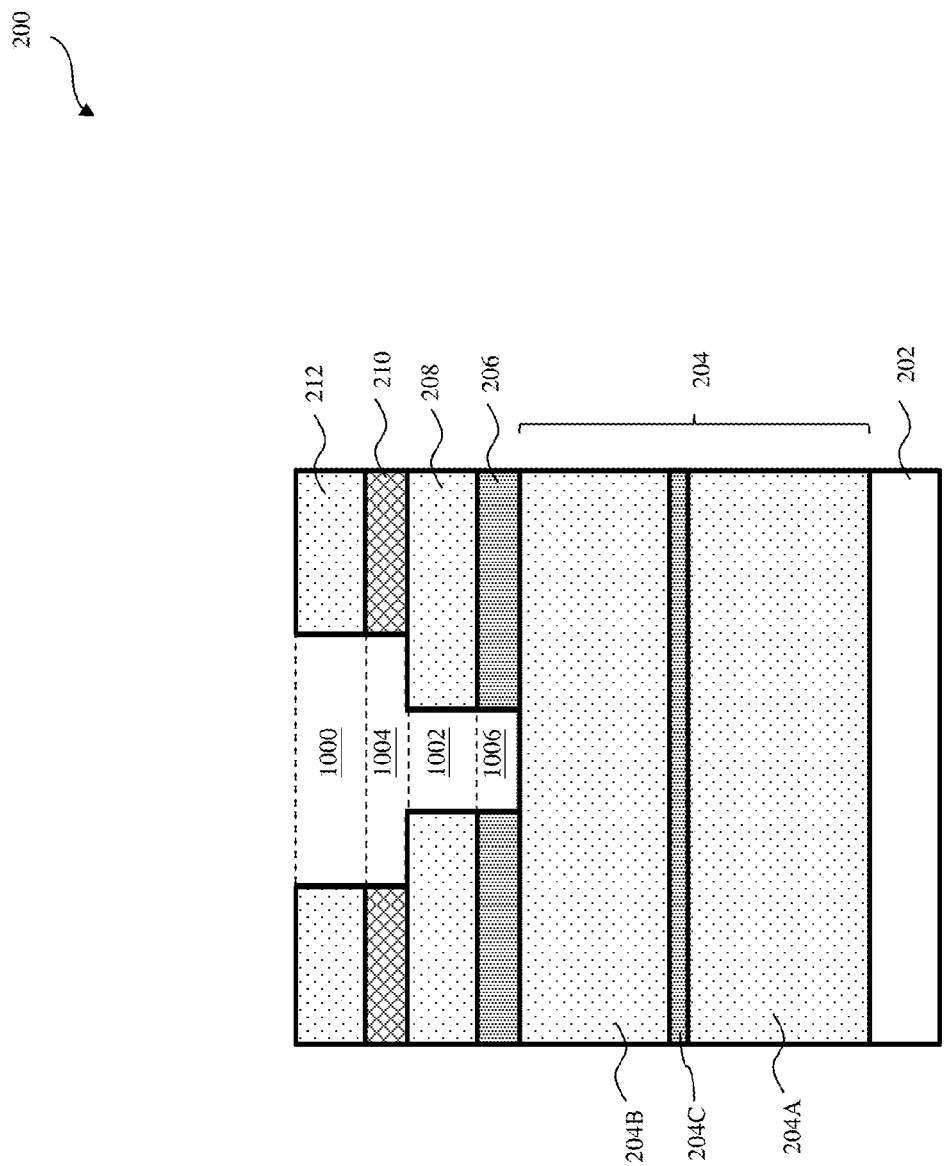

Referring to FIG. 11A, an etch process is applied to selectively etch the second material layer 206 and remove the portion of the second material layer 206 aligned with the opening 1002 in the first photoresist layer 208. As illustrated in FIG. 11A, an opening 1006 is formed in the second material layer 206. The etch process and the etchant are properly chosen for selective etch without damage to the photoresist.

Figure 11B:
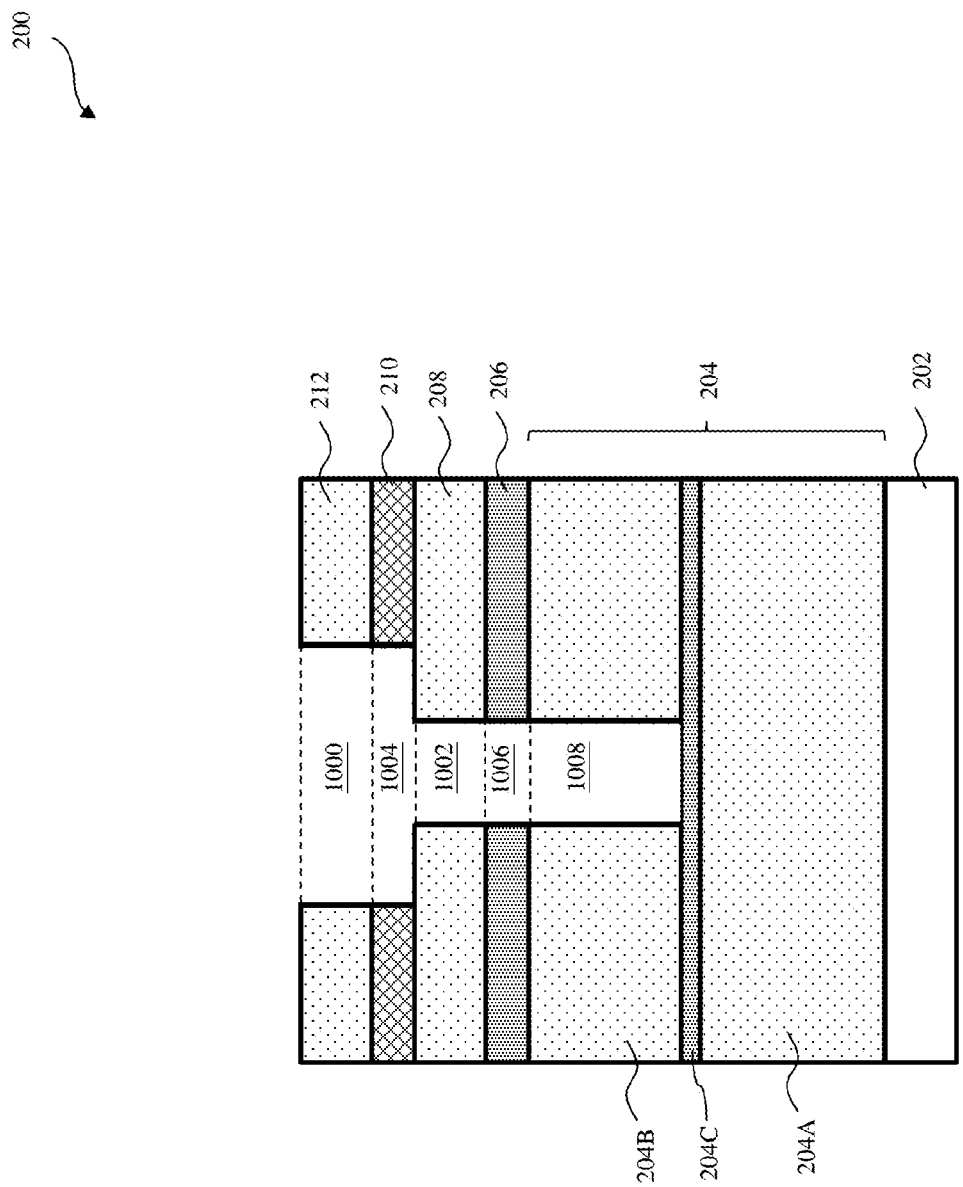

Referring to FIG. 11B, an etch process is applied to selectively etch the second ILD material layer 204B within an opening including the openings 1002 and 1006, thereby forming a trench 1008 in the second ILD material layer 204B. The etch process stops on the etch stop layer 204C. The etch process is properly chosen to form the trench 1008. For example, dry etch, wet etch, or a combination thereof, may be applied for transferring the opening including the openings 1002 and 1006 to the second ILD material layer 204B, forming the trench 902.

Figure 11C:
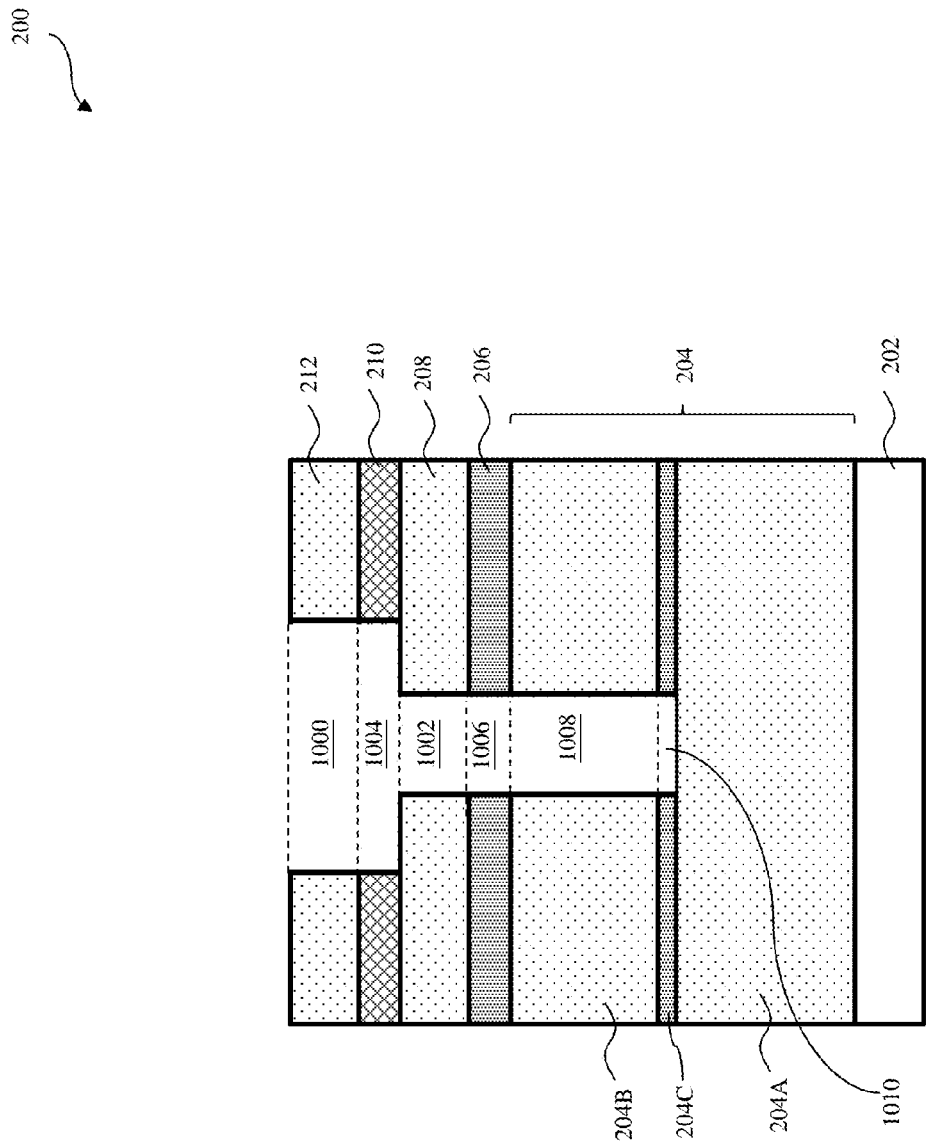

Referring to FIG. 11C, another etch process is applied to selectively etch the etch stop layer 204C within the trench 1008. The etch process is properly chosen to form the trench including the trench 1008 and the opening 1010 in the etch stop layer 204C. In one embodiment, a wet etch may be applied to open the etch stop layer 204C. For example where the etch stop layer 204C includes silicon oxide, a hydrofluoride (HF) may be used as etchant to etch the etch stop layer 204C.

Referring to FIG. 11D, in one embodiment, a trimming process is applied to trim the photoresist layers and the protective layer 210, thereby removing the uncovered portions of the first photoresist layer 208, the second photoresist layer 212, and the protective layer 210. In one embodiment, the trimming process is similar to a process to strip the photoresist. For example, the trimming process includes a wet stripping process. The opening 1000 in the second photoresist layer 212 is transferred to the opening 1012 in the first photoresist layer 208. In some embodiments, another etch process is applied to selectively etch both the first ILD material layer 204A and the second ILD material layer 204B using the second material layer 206 as an etch mask, thereby forming a first trench 1014 for the via feature in the first ILD material layer 204A and the etch stop layer 204C.

Figure 11E:
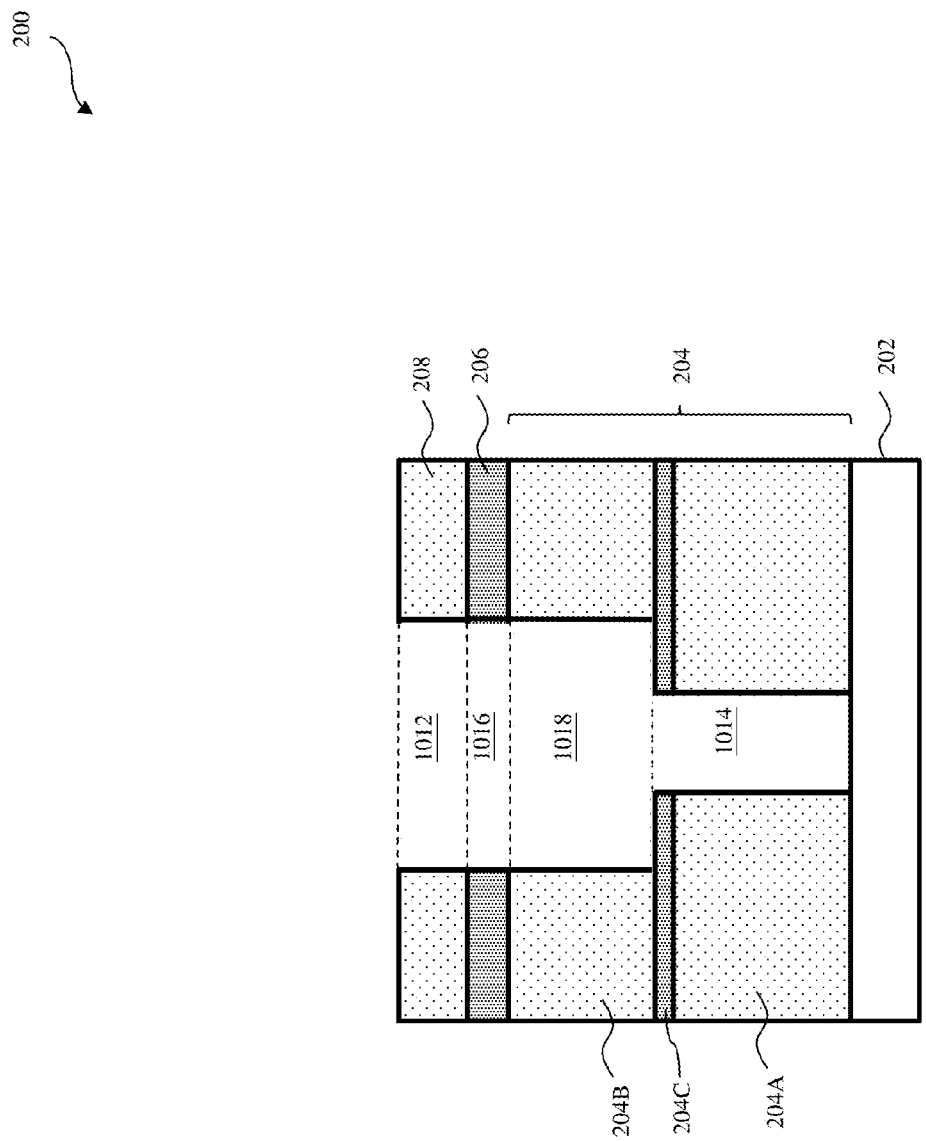

Referring to FIG. 11E, in an embodiment, an etch process is applied to etch the second material layer 206 within the opening 1012, thereby transferring the opening 1012 to the opening 1016 in the second material layer 206. Another etch process is applied to selectively etch the second ILD material layer 204B using the second material layer 206 as an etch mask, thereby forming a second trench 1018 for the metal line in the second ILD material layer 204B.

Referring to FIG. 11F, other operations may be subsequently implemented. For example, the first photoresist layer 208 and the second material layer 206 may be removed by wet stripping or plasma ashing.

Although the procedure to form the via trench 1014 and the metal line trench 1018 is provided above according to one or more embodiments, other procedures may be alternatively applicable to form the via trench 1014 and the metal line trench 1018 using the patterned first and second photoresist layers. For example, after the second material layer 206 is patterned as illustrated in FIG. 11A, a single etch process may be implemented to form the via trench 1014 and the metal line trench 1018 in respective ILD material layers. This can be achieved when various materials (including the first photoresist layer 208, the second photoresist layer 212, the protective layer 210, the second material layer 206 and the ILD material layers 204A and 204B) are properly chosen in terms of etch rate. In furtherance of this example, the etch stop layer 204C may be eliminated.

Referring to FIG. 11G, in one embodiment, via feature 1020 and metal line 1022 are formed by a suitable procedure. In one embodiment, a conductive material, such as metal or metal alloy, is used to fill in the via trench 1014 and the metal line trench 1018 (FIG. 11F) by deposition, such as physical vapor deposition (PVD). A chemical mechanical polishing (CMP) process is applied to remove excessive conductive material and to planarize the top surface.

In some embodiments, the second material layer 206 may serve as a polishing stop layer and may be removed after the CMP process by an etch process. In a particular example, copper is used as the conductive material. In furtherance of this example, a copper seed layer is formed by PVD. Thereafter, bulk copper is used to fill in the trenches 1014 and 1018 by plating. A CMP process is subsequently applied to remove the excessive copper and planarize the top surface.

In some embodiments, as shown in the example of FIG. 11H, a lining material 1026, such as titanium nitride, is formed on the sidewalls of the via trench 1014 and the metal line trench 1018 before filling in the trenches with the conductive material. The lining layer is deposited by a proper technique, such as PVD or CVD. The lining layer may function as a diffusion barrier and adhesive layer for integrity of the interconnect structure.

Although not shown, other processing operations may be presented to form various doped regions such as source and drain regions and/or devices features such as gate electrode. In one example, the substrate may alternatively include other material layer to be patterned by the disclosed method, such as another patterned metal layer. In another example, additional patterning steps may be applied to the substrate to form a gate stack. In another example, the source and drain features are of either an n-type dopant or a p-type dopant are formed by a conventional doping process such as ion implantation.

In some embodiments, as discussed above with reference to FIGS. 8C-8D, the bottom latent pattern 708 and the top latent pattern 812 are intrinsically related. Accordingly, a feature associated with the bottom latent pattern 708 (e.g., the via feature 1020) and a feature associated with the top latent pattern 812 (e.g., the metal line 1022) may be intrinsically related to each other in terms of geometry (e.g., shape and/or size). For example, the relative shapes and sizes of the via feature 1020 and metal line 1022 may be substantially similar to the relative shapes and sizes of the bottom latent pattern 708 and the top latent pattern 812 discussed above with reference to FIGS. 8C-8D.

Various advantages may be present in various applications of the present disclosure. No particular advantage is required for all embodiments, and that different embodiments may offer different advantages. One of the advantages in some embodiments is that the protective layer reduces intermixing between neighboring photoresist layers, thereby improving the formation of the patterns. For example, the protective layer may have a polarity higher than neighboring layers to decrease solubility of neighboring layers in a solvent of the protective layer and to decrease solubility of the protective layer in solvents of neighboring layers. For further example, a chelating agent of the protective layer may be capable of binding to ions, trapping ions diffused from neighboring layers, thereby reducing ionic additives diffusion of the neighboring layers. Also, the protective layer may include a crosslinking agent, and become cross-linked to include larger molecule polymers to reduce the intermixing. Another advantage in some embodiments is that the same developer may be used to develop the photoresist layers including different photoresist materials and the protective layer during one development process, which may reduce cost and save process time. Yet another advantage in some embodiments is that the impact of overlay errors during the two lithography exposure processes may be minimized, because the latent features for the via feature and the via-connecting portion of the metal line may be formed during the first lithography exposure process, and the via feature and the via-connecting portion of the metal line are spatially synchronized with various variations excluded.

Other manufacturing operations may be implemented before, during or after the method 100. In one embodiment, a procedure including metal deposition and CMP is implemented thereafter to form a via feature (or contact feature) and a metal line overlapped and aligned.

Thus, the present disclosure provides an embodiment of a method of forming a semiconductor device. The method includes forming a first photoresist layer over a substrate, depositing a protective layer material over the first photoresist layer to form a protective layer, and forming a second photoresist layer over the protective layer. A first lithography exposure process is performed, through a first mask, to expose the first photoresist layer and the second photoresist layer, and to form a bottom latent pattern in the first photoresist layer. A second lithography exposure process is performed, through a second mask, to expose the first photoresist layer and the second photoresist layer, and to form a top latent pattern in the second photoresist layer, where the top latent pattern at least partially overlaps the bottom latent pattern. The first photoresist layer, the protective layer, and the second photoresist layer are developed to form a first main feature from the bottom latent pattern, a second main feature from the top latent pattern, and an opening in the protective layer vertically aligned with the second main feature.

The present disclosure also provides an embodiment of a method of forming a semiconductor device. The method includes forming a first photoresist layer with a first set of ionic additives over a substrate and forming a second photoresist layer with a second set of ionic additives over a first photoresist layer. A concentration of a chelating agent in a protective layer material is selected according to a concentration of the first set of ionic additives in the first photoresist layer and a concentration of the second set of ionic additives in the second photoresist layer. After forming the first photoresist layer and prior to forming the second photoresist layer, the protective layer material with the selected chelating agent concentration is deposited over the first photoresist layer to form a protective layer disposed between the first photoresist layer and the second photoresist layer. A first lithography exposure process is performed to the first photoresist layer and the second photoresist layer using a first photomask to form a first latent pattern in the first photoresist layer. A second lithography exposure process is performed to the first photoresist layer and the second photoresist layer using a second photomask to form a second latent pattern in the second photoresist layer. The first photoresist layer, the protective layer, and the second photoresist layer are developed by using a developer to form a first main feature from the first latent pattern, a second main feature from the second latent pattern, and an opening in the protective layer.

The present disclosure further provides an embodiment of a method of forming a semiconductor device. The method includes forming a first photoresist layer of a first material with a first exposure threshold over a substrate, depositing a protective layer including a polymer, a solvent, and a chelating agent over the first photoresist layer, and forming a second photoresist layer of a second material with a second exposure threshold over the protective layer. A first lithography exposure process is performed, through a first mask, to expose the first photoresist layer and the second photoresist layer, and to form a bottom latent pattern in the first photoresist layer. A second lithography exposure process is performed, through a second mask, to expose the first photoresist layer and the second photoresist layer, and to form a top latent pattern in the second photoresist layer, where a region in the first photoresist layer other than the first latent pattern receives an exposure dose less than the first exposure threshold.

Although the present disclosure and advantages of some embodiments have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of fabricating a semiconductor device, comprising:

forming a protective layer over a first photoresist layer disposed over a substrate;

forming a second photoresist layer over the protective layer;

performing a first lithography exposure process, through a first mask, to expose the first photoresist layer and the second photoresist layer, and to form a bottom latent pattern in the first photoresist layer;

performing a second lithography exposure process, through a second mask different from the first mask, to expose the second photoresist layer, and to form a top latent pattern in the second photoresist layer, wherein the top latent pattern at least partially overlaps the bottom latent pattern; and developing the first photoresist layer and the second photoresist layer to form a first main feature from the bottom latent pattern, and a second main feature from the top latent pattern.

2. The method of claim 1, further comprising:

adjusting a polarity of a protective layer material according to a polarity of the first photoresist layer and a polarity of the second photoresist layer;

wherein the forming the protective layer includes depositing the protective layer material over the first photoresist layer.

3. The method of claim 2, wherein the protective layer material includes a polymer having a percent by weight of greater than about 20% of one or more polar functional groups.

4. The method of claim 3, wherein the protective layer material includes a solvent having one or more polar functional groups, and wherein a relative energy difference (RED) between the polymer of the protective layer material and the solvent of the protective layer is less than 1.

5. The method of claim 2, wherein the protective layer material includes a chelating agent.

6. The method of claim 5, further comprising:

prior to the depositing the protective layer material over the first photoresist layer, tuning a concentration of the chelating agent in the protective layer material according to a concentration of ionic additives in the first photoresist layer and a concentration of ionic additives in the second photoresist layer.

7. The method of claim 2, further comprising:

before the performing the first lithography exposure process and the performing the second lithography exposure process, performing a pre-exposure treatment process to crosslink the protective layer, wherein the cross-linked protective layer includes larger molecule polymers than a non-cross-linked protective layer.

8. The method of claim 1, further comprising:

transferring, by an etching process, the first main feature and the second main feature to the substrate.

9. A method, comprising:

forming a first photoresist layer with a first set of ionic additives over a substrate;

forming a second photoresist layer with a second set of ionic additives over a first photoresist layer;

after forming the first photoresist layer and prior to forming the second photoresist layer, depositing a protective layer material with a selected chelating agent concentration of a chelating agent over the first photoresist layer to form a protective layer disposed between the first photoresist layer and the second photoresist layer;

performing a first lithography exposure process to the first photoresist layer and the second photoresist layer using a first photomask to form a first latent pattern in the first photoresist layer;

performing a second lithography exposure process to the first photoresist layer and the second photoresist layer using a second photomask different from the first photomask to form a second latent pattern in the second photoresist layer; and developing the first photoresist layer, the protective layer, and the second photoresist layer by using a developer to form a first main feature from the first latent pattern, a second main feature from the second latent pattern, and an opening in the protective layer.

10. The method of claim 9, further comprising:
prior to the depositing the protective layer material over the first photoresist layer, choosing a molecular weight of the chelating agent of the protective layer material according to the concentration of the first set of ionic additives in the first photoresist layer and the concentration of the second set of ionic additives in the second photoresist layer.

11. The method of claim 9, further comprising:
prior to the depositing the protective layer material over the first photoresist layer, adjusting a polarity of the protective layer material according to a polarity of the first photoresist layer and a polarity of the second photoresist layer.

12. The method of claim 11, wherein the protective layer material includes a polymer having a percent by weight of greater than about 20% of one or more polar functional groups.

13. The method of claim 9, further comprising:
prior to the performing the first lithography exposure process and the performing the second lithography exposure process, performing a pre-exposure process to crosslink a first polymer of the protective layer and a second polymer of the protective layer by reactions including the chelating agent of the protective layer.

14. The method of claim 9, wherein the second lithography exposure process is performed prior to the performing the first lithography exposure process, and wherein the second latent pattern in the second photoresist layer is formed prior to the forming the first latent pattern in the first photoresist layer.

15. The method of claim 9, wherein the chelating agent includes an electron acceptor group.

16. The method of claim 9, wherein the chelating agent includes an electron donating group.

17. A method, comprising:
forming a first photoresist layer of a first material with a first exposure threshold over a substrate;

depositing a protective layer including a polymer, a solvent, and a chelating agent over the first photoresist layer;

forming a second photoresist layer of a second material with a second exposure threshold over the protective layer;

performing a first lithography exposure process, through a first mask, to expose the first photoresist layer and the second photoresist layer, and to form a bottom latent pattern in the first photoresist layer; and performing a second lithography exposure process, through a second mask different from the first mask, to expose the first photoresist layer and the second photoresist layer, and to form a top latent pattern in the second photoresist layer, wherein a region in the first photoresist layer other than the bottom latent pattern receives an exposure dose less than the first exposure threshold.

18. The method of claim 17, wherein the first exposure threshold of the first material is greater than the second exposure threshold of the second material.

19. The method of claim 17, wherein the first exposure threshold is substantially the same as the second exposure threshold.

20. The method of claim 17, further comprising:
prior to the performing the first lithography exposure process and the performing the second lithography exposure process, crosslinking the protective layer by performing a pre-exposure treatment process.

* * * * *